(12) United States Patent
Cupeta et al.

(10) Patent No.: US 9,166,159 B2
(45) Date of Patent: Oct. 20, 2015

(54) SEMICONDUCTOR CONSTRUCTIONS AND METHODS OF FORMING MEMORY CELLS

(71) Applicant: Micron Technology, Inc., Boise, ID (US)

(72) Inventors: Carmela Cupeta, Milan (IT); Andrea Redaelli, Casatenovo (IT); Paolo Giuseppe Cappelletti, Seveso (IT)

(73) Assignee: Micron Technology, Inc., Boise, ID (US)

( * ) Notice: Subject to any disclaimer, the term of this patent is extended or adjusted under 35 U.S.C. 154(b) by 146 days.

(21) Appl. No.: 13/901,195

(22) Filed: May 23, 2013

(65) Prior Publication Data

US 2014/0346429 A1 Nov. 27, 2014

(51) Int. Cl.
*H01L 29/02* (2006.01)
*H01L 45/00* (2006.01)
*H01L 27/24* (2006.01)

(52) U.S. Cl.
CPC ........ *H01L 45/1253* (2013.01); *H01L 27/2445* (2013.01); *H01L 27/2463* (2013.01); *H01L 29/02* (2013.01); *H01L 45/06* (2013.01); *H01L 45/124* (2013.01); *H01L 45/1233* (2013.01); *H01L 45/144* (2013.01); *H01L 45/16* (2013.01); *H01L 45/1691* (2013.01)

(58) Field of Classification Search
CPC ....................................................... H01L 29/02
USPC .................................. 257/2, 4; 438/102, 382
See application file for complete search history.

(56) References Cited

U.S. PATENT DOCUMENTS

| | | | |
|---|---|---|---|
| 5,789,277 A | 8/1998 | Zahorik et al. | |
| 6,831,330 B2 | 12/2004 | Harshfield | |
| 7,262,502 B2 | 8/2007 | Chang | |
| 7,411,208 B2 | 8/2008 | Hwang et al. | |
| 7,514,288 B2 | 4/2009 | Lung et al. | |
| 7,514,334 B2 | 4/2009 | Chen et al. | |
| 7,569,844 B2 * | 8/2009 | Lung ................................. | 257/2 |
| 7,929,340 B2 | 4/2011 | Lung et al. | |

(Continued)

FOREIGN PATENT DOCUMENTS

| | | |
|---|---|---|
| KR | 10-2006-0046790 | 5/2006 |
| KR | 2008-0028544 | 4/2008 |

(Continued)

OTHER PUBLICATIONS

Ziegler, et al.; CMOS/Nano Co-Design for Crossbar-Based Molecular Electronic Systems: IEEE Transactions on Nanotechnology, vol. 2, No. 4, Dec. 2003, 14 pages.

(Continued)

*Primary Examiner* — David Vu
*Assistant Examiner* — Brandon Fox
(74) *Attorney, Agent, or Firm* — Wells St. John P.S.

(57) ABSTRACT

Some embodiments include semiconductor constructions having stacks containing electrically conductive material over dielectric material. Programmable material structures are directly against both the electrically conductive material and the dielectric material along sidewall surfaces of the stacks. Electrode material electrically coupled with the electrically conductive material of the stacks. Some embodiments include methods of forming memory cells in which a programmable material plate is formed along a sidewall surface of a stack containing electrically conductive material and dielectric material.

11 Claims, 32 Drawing Sheets

(56) References Cited

U.S. PATENT DOCUMENTS

| | | |
|---|---|---|
| 8,030,128 B1 * | 10/2011 | Sutardja et al. ............... 438/102 |
| 8,043,961 B2 | 10/2011 | Moore et al. |
| 8,053,365 B2 | 11/2011 | Humayun et al. |
| 8,513,136 B2 | 8/2013 | Park et al. |
| 2003/0193053 A1 | 10/2003 | Gilton |
| 2006/0211165 A1 | 9/2006 | Hwang et al. |
| 2007/0120107 A1 | 5/2007 | Hayakawa |
| 2008/0035961 A1 | 2/2008 | Chen et al. |
| 2008/0099753 A1 | 5/2008 | Song et al. |
| 2008/0142773 A1 | 6/2008 | Campbell |
| 2008/0246116 A1 | 10/2008 | Mouttet |
| 2008/0303014 A1 | 12/2008 | Goux et al. |
| 2009/0029031 A1 | 1/2009 | Lowrey |
| 2009/0072215 A1 | 3/2009 | Lung et al. |
| 2009/0091971 A1 | 4/2009 | Dennison et al. |
| 2009/0137080 A1 | 5/2009 | Chang et al. |
| 2009/0302472 A1 | 12/2009 | Yoon et al. |
| 2010/0059729 A1 | 3/2010 | Hudgens |
| 2010/0163817 A1 | 7/2010 | Savransky et al. |
| 2010/0207095 A1 | 8/2010 | Lai et al. |
| 2011/0278528 A1 * | 11/2011 | Lung et al. ...................... 257/2 |
| 2011/0300685 A1 * | 12/2011 | Horii et al. .................... 438/382 |
| 2012/0019349 A1 | 1/2012 | Bian |

FOREIGN PATENT DOCUMENTS

| | | |
|---|---|---|
| KR | 10-2009-0090538 | 8/2009 |
| WO | 2008/027163 | 3/2008 |
| WO | PCT/US2013/048656 | 10/2013 |

OTHER PUBLICATIONS

U.S. Appl. No. 13/551,975, filed Jul. 18, 2012 by Pellizzer et al.

* cited by examiner

US 9,166,159 B2

SEMICONDUCTOR CONSTRUCTIONS AND METHODS OF FORMING MEMORY CELLS

TECHNICAL FIELD

Semiconductor constructions and methods of forming memory cells.

BACKGROUND

Memory is one type of integrated circuitry, and is used in electronic systems for storing data. Integrated memory is usually fabricated in one or more arrays of individual memory cells. The memory cells are configured to retain or store memory in at least two different selectable states. In a binary system, the states are considered as either a "0" or a "1". In other systems, at least some individual memory cells may be configured to store more than two levels or states of information.

One type of memory is phase change memory (PCM). Such memory utilizes phase change material as a programmable material. Example phase change materials that may be utilized in PCM are chalcogenide materials.

The phase change material reversibly transforms from one phase to another through application of appropriate stimulus. Each phase may be utilized as a memory state, and thus an individual PCM cell may have two selectable memory states that correspond to two inducible phases of the phase change material.

The phase change materials may be difficult to incorporate into memory cells in that edges of the phase change materials may be damaged during fabrication of the memory cells. Accordingly it is desired to develop new architectures and fabrication methods which are suitable for incorporating phase change materials into memory cells. Similar problems may occur with other types of memory, and accordingly it would be desirable for the new architectures and fabrication methods to be extendible to additional memory besides phase change memory.

DETAILED DESCRIPTION OF THE ILLUSTRATED EMBODIMENTS

Some embodiments include methods of fabricating memory (for instance, phase change memory) in which the final height of a functional region of programmable material in a memory cell is determined by the thickness of dielectric material in a stack, rather than by an actual height of the programmable material. An advantage of such embodiments is that the heights of the functional regions of programmable material in memory cells may be set with process steps which are relatively easy to control (the thickness of a dielectric material), rather than with process steps which may be relatively difficult to control (e.g., the amount of etch-back of programmable material). Another advantage is that if damage occurs to the top edge of the programmable material, such damage will be spaced from the functional region of the programmable material. Thus, negative consequences of such damage relative to performance characteristics of memory cells may be alleviated, or even entirely eliminated. Example embodiments are described with reference to FIGS. 1-48.

Figure 1:
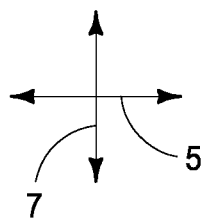
FIGS. 1-3 are a top view and cross-sectional side views of a construction at a processing stage of an example embodiment method. The cross-sectional views of FIGS. 2 and 3 are along the lines A-A and B-B, respectively, of FIG. 1.
Figure 1:
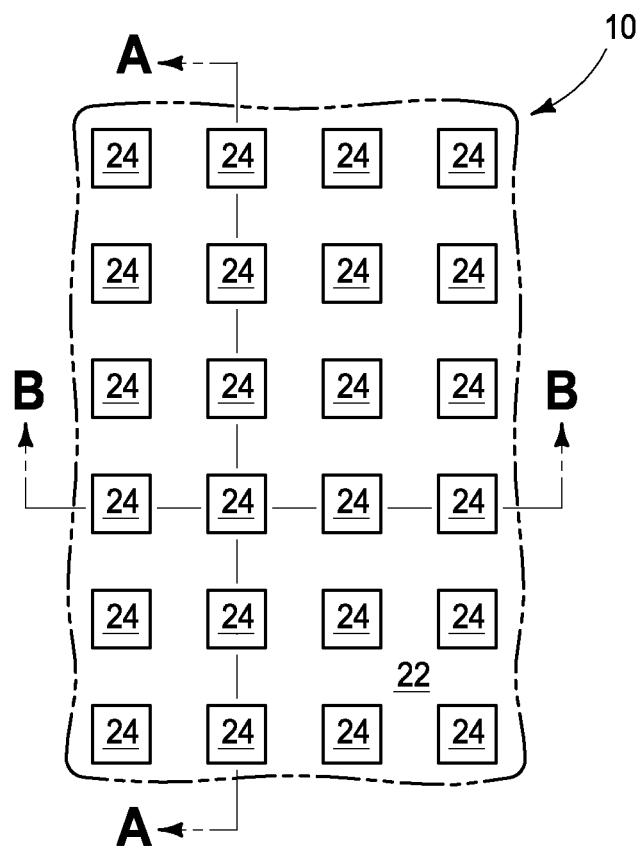
Figure 2:
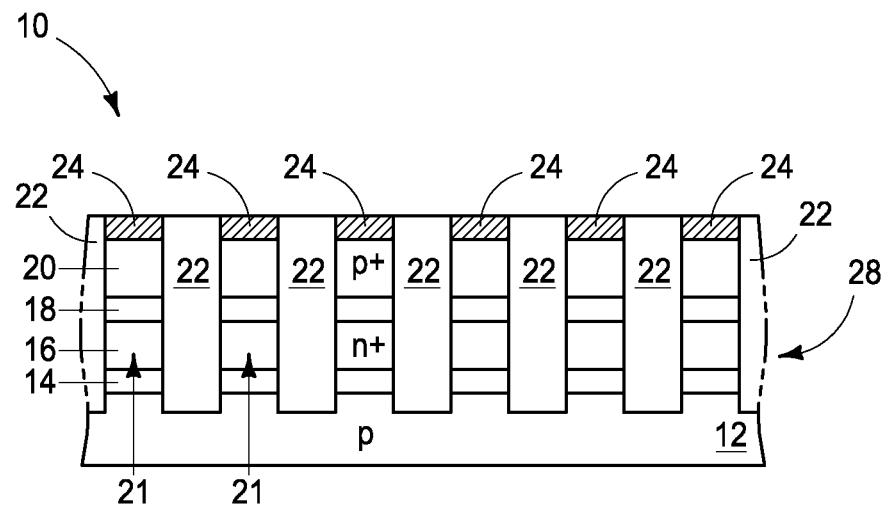
Figure 3:
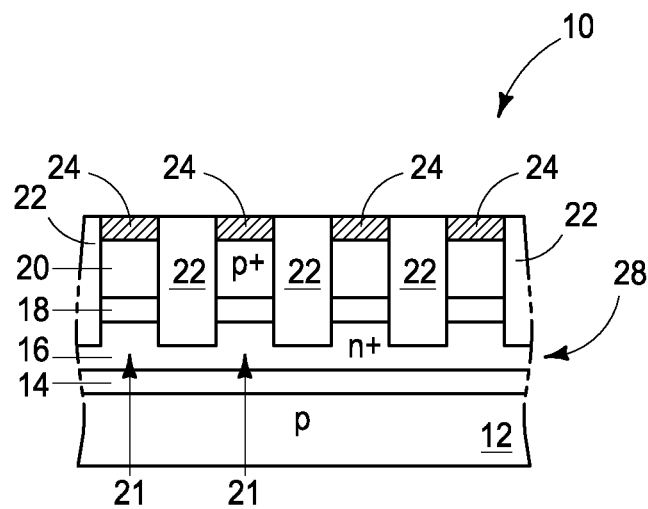

Referring to FIGS. 1-3, a portion of a semiconductor construction 10 is diagrammatically illustrated at a process stage of an example embodiment fabrication process. FIG. 1 shows a top view of the construction, and FIGS. 2 and 3 show cross-sections along the lines A-A and B-B, respectively, of FIG. 1.

The construction 10 comprises a p-type doped region 12 (which may be referred to as a substrate 12 in some embodiments, and as a collector region 12 in specific embodiments in which it is part of a bipolar junction transistor), and various doped regions 14, 16, 18 and 20 over the region 12. The regions 12, 14, 16 and 18 are patterned into a plurality of pedestals 21 (only some of which are labeled), with such pedestals being separated from one another by intervening dielectric material 22. Material 22 may be alternatively referred to as an electrically insulative material; with the terms "electrically insulative material" and "dielectric material" being synonymous with one another. Material 22 may comprise any suitable composition or combination of compositions, and in some embodiments may comprise oxygen-containing material; such as, for example, silicon dioxide, borophosphosilicate glass (BPSG), phosphosilicate glass (PSG), etc. The doped regions 14, 16, 18 and 20 correspond to doped semiconductor material, such as doped silicon.

The regions 16 and 20 are heavily-doped, and thus are indicated to be n+ doped and p+ doped, respectively. The p-type doped region 12, n-type doped region 16 and p-type doped region 20 together form pn diodes in some embodiments. The regions 14 and 18 are lightly doped, and are utilized as graded junctions to improve performance of such diodes. In some embodiments, the regions 12, 16 and 20 may be regions of bipolar junction transistors.

Electrically conductive material 24 is formed across the tops of the diodes. Such electrically conductive material may comprise any suitable composition or combination of compositions; and in some embodiments may comprise metal silicide (such as, for example, cobalt silicide, titanium silicide, nickel silicide, etc.). Such conductive material may be formed by silicidation of upper surfaces of doped regions 20 in some embodiments. Although the conductive material 24 is shown to have an upper surface substantially coplanar with the upper surface of insulative material 22, in other embodiments the conductive material 24 may have an upper surface which is above or below the upper surface of insulative material 22.

In the shown embodiment, the tops of pedestals 21 are square (as indicated by the square shape of material 24 in the top view of FIG. 1), but in other embodiments the tops of the pedestals may have other shapes; such as, for example, polygonal shapes, round shapes, elliptical shapes, rounded corner shapes, etc.

The pedestals 21 are arranged in a grid (as indicated by the illustrated regions of material 24 being arranged in a grid in the top view of FIG. 1). Such grid has a first direction along an axis 5, and a second direction along an axis 7 (with the axes 5 and 7 being illustrated adjacent the top view of FIG. 1). In the shown embodiment, the second direction is substantially orthogonal to the first direction; with the term "substantially orthogonal" meaning that the directions are orthogonal to within reasonable tolerances of fabrication and measurement. The cross-section of FIG. 2 is along axis 7, and that of FIG. 3 is along axis 5.

The cross-sections of FIGS. 2 and 3 show that the pedestals 21 extend deeper along the cross-section of FIG. 2 than along the cross-section of FIG. 3. Specifically, the pedestals extend through regions 14 and 16, and into region 12 along the cross-section of FIG. 2; and extend only partially into region 16 along the cross-section of FIG. 3. In some embodiments, heavily-doped region 16 may be considered to form wordlines which interconnect pluralities of diodes along the direction of axis 5; with an example wordline 28 being illustrated in FIG. 3. As used herein and through the description, "wordline" is a synonym of access line and "bitline" is a synonym of data line.

The illustrated pn diodes are examples of access devices which may be incorporated into a memory array. Other access devices may be utilized in place of, or in addition to, the illustrated diodes in other embodiments. Such other access devices may include, for example, field effect transistors, bipolar junction transistors, PIN diodes, etc.

In some embodiments, construction 10 may be considered to comprise a semiconductor substrate. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above. Construction 10 may correspond to a semiconductor substrate containing one or more materials associated with integrated circuit fabrication in some embodiments. Some of the materials may be under the shown region 12 and/or may be laterally adjacent the shown region 12; and may correspond to, for example, one or more of refractory metal materials, barrier materials, diffusion materials, insulator materials, etc.

Figure 4:
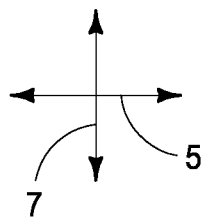
FIGS. 4-6 are a top view and cross-sectional side views of a construction at an example processing stage subsequent to that of FIGS. 1-3. The cross-sectional views of FIGS. 5 and 6 are along the lines A-A and B-B, respectively, of FIG. 4.
Figure 4:
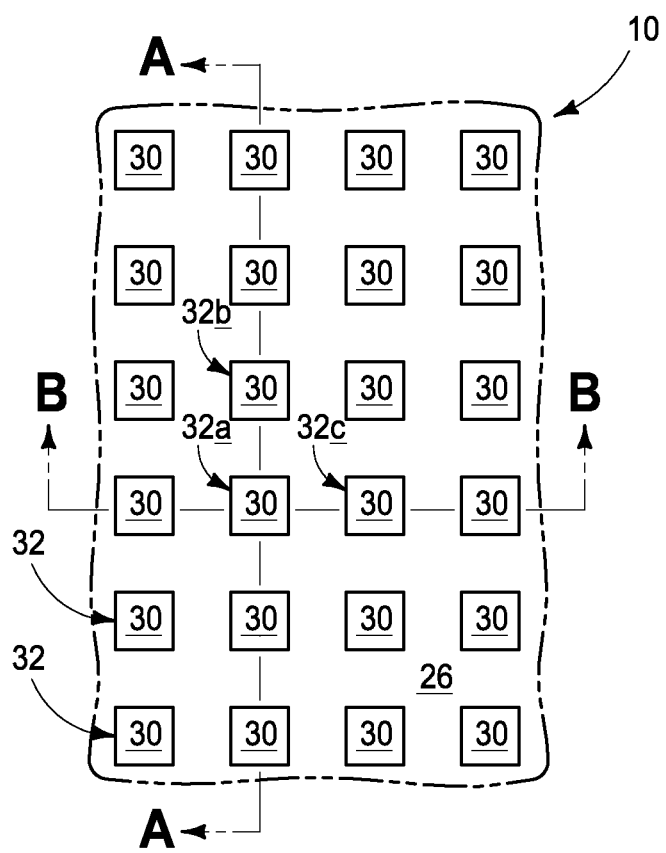
Figure 5:
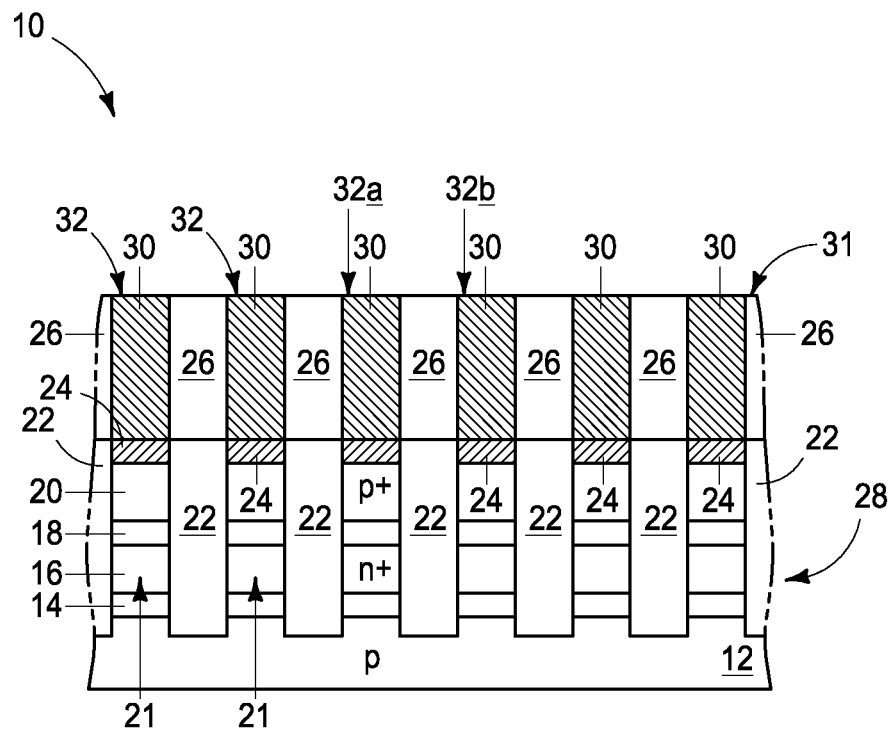
Figure 6:
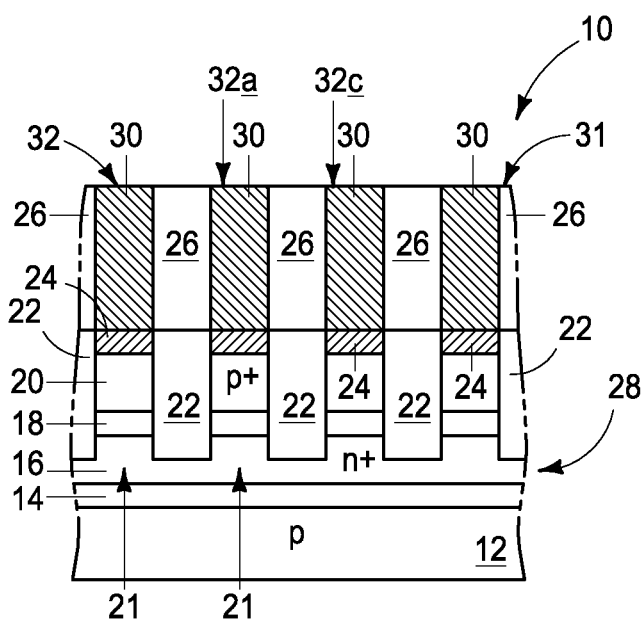

Referring to FIGS. 4-6, electrically insulative material 26 is formed across construction 10, and subsequently openings are formed through material 26 to conductive material 24 and filled with a conductive material 30.

The conductive material 30 may comprise any suitable composition or combination of compositions; and in some embodiments may comprise, consist essentially of, or consist of one or more of various metals (for example, tungsten, titanium, etc.), metal-containing compositions (for instance, metal nitride, metal carbide, metal silicide, etc.), and conductively-doped semiconductor materials (for instance, conductively-doped silicon, conductively-doped germanium, etc.). In some example embodiments, material 30 may comprise one or more of titanium nitride, titanium aluminum nitride, titanium silicon nitride, etc. In some example embodiments, material 30 may comprise a liner of titanium nitride around a fill of tungsten.

The insulative material 26 may comprise any suitable composition or combination of compositions. In some embodiments, material 26 may comprise a same composition as material 22, and accordingly material 26 may comprise an oxygen-containing composition, such as, for example, one or more of silicon dioxide, BPSG, PSG, etc. In some embodiments material 26 may comprise a different composition than material 22; and may, for example, comprise a non-oxygen-containing composition, such as, for example, silicon nitride.

Although material 26 is shown to be homogeneous, in some embodiments the material 26 may comprise multiple discrete compositions.

A planarized surface 31 is shown extending across materials 30 and 26. Such surface may result from chemical-mechanical polishing (CMP). For instance, material 30 may be initially provided to overfill openings in material 26, and subsequently CMP may be utilized to remove excess material 30 and form the shown planarized surface 31.

The material 30 may be considered to form a plurality of conductive plugs, with upper regions of the conductive plugs corresponding to a plurality of spaced-apart electrical nodes 32 (only some of which are labeled) across the top of construction 10. The insulative material 26 entirely laterally surrounds the nodes 32 in the shown embodiment. In some embodiments, the nodes 32 may be considered to be supported by a semiconductor substrate comprising region 12. In some embodiments, the nodes 32 may correspond to first electrodes (or bottom electrodes) of memory cells (with example memory cells being shown in FIGS. 34-36).

The electrical nodes are arranged in the grid comprising the first direction along axis 5 and the second direction along axis 7. In some embodiments, the nodes may be considered to be arranged in a two-dimensional array having columns along the direction of axis 7 and rows along the direction of axis 5. In the shown embodiment, nodes 32 along common rows as one another are electrically coupled to one another through wordlines (e.g., wordline 28) under the rows.

Three of the nodes 32 are labeled as nodes 32a, 32b and 32c. The nodes 32a-c are substantially identical to one another, and substantially identical to all of the other nodes 32; but are called out specifically to aid in explaining some of the example embodiments.

Figure 7:
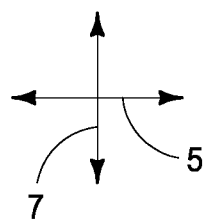
FIGS. 7-9 are a top view and cross-sectional side views of a construction at an example processing stage subsequent to that of FIGS. 4-6. The cross-sectional views of FIGS. 8 and 9 are along the lines A-A and B-B, respectively, of FIG. 7.
Figure 7:
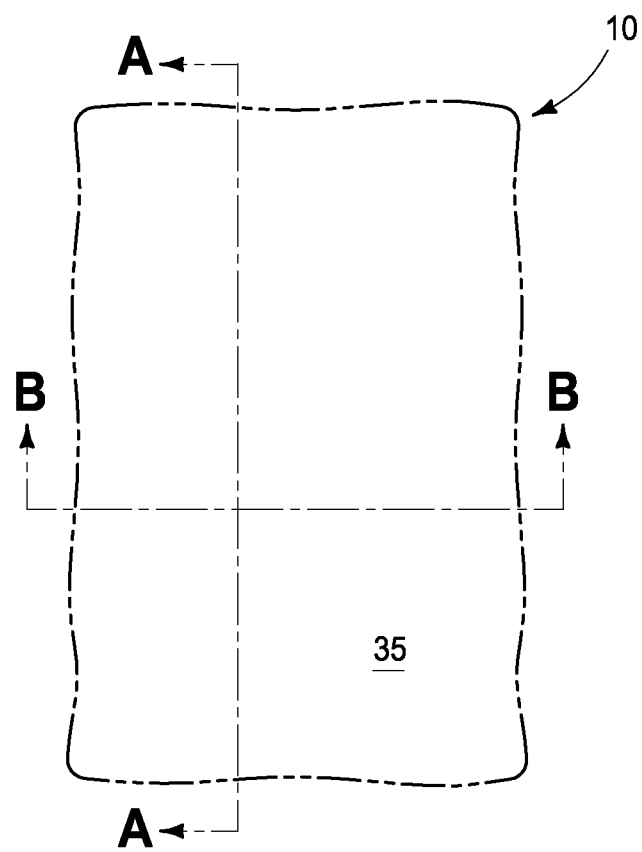
Figure 8:
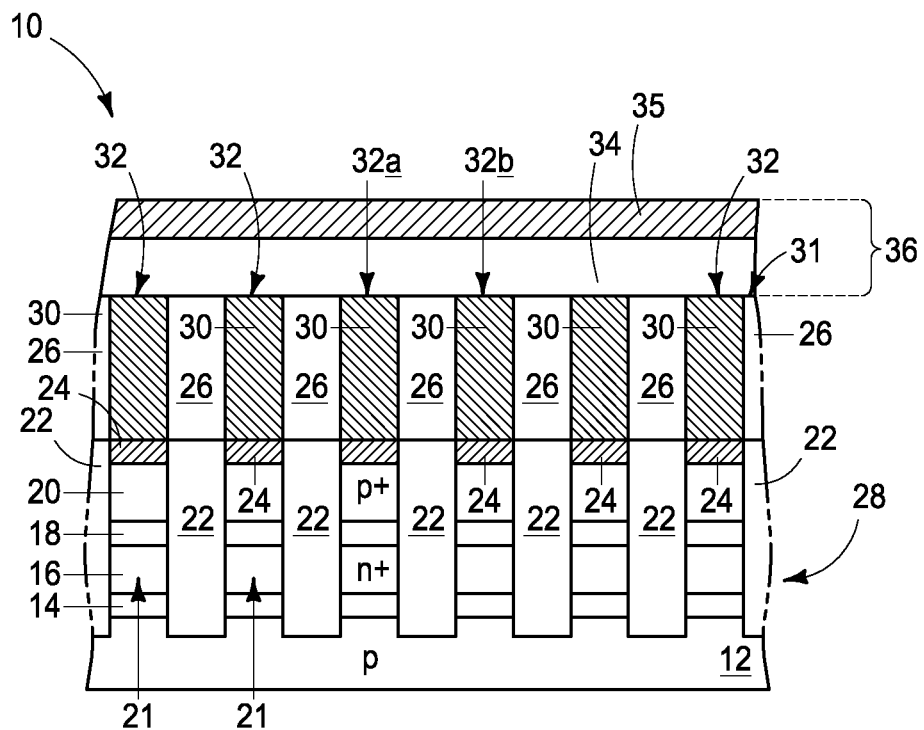
Figure 9:
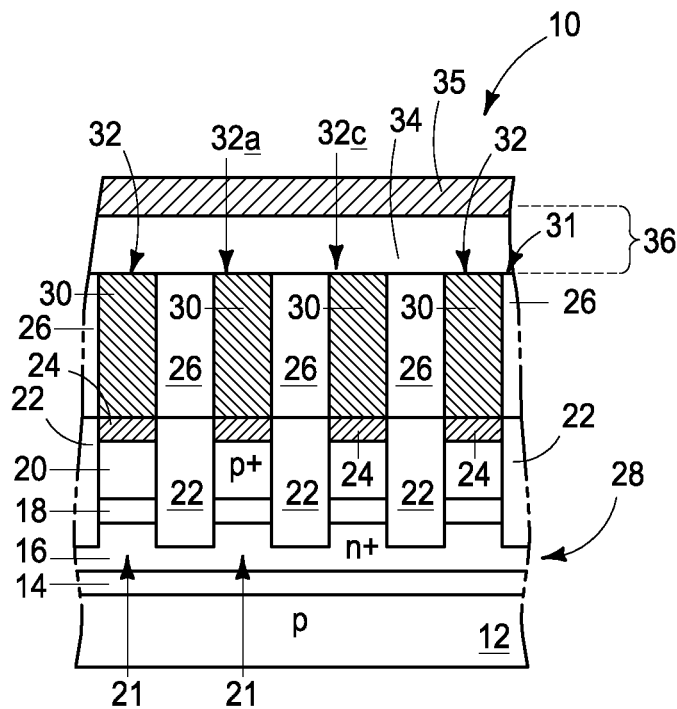

Referring to FIGS. 7-9, a stack 36 is formed over planarized surface 31. In the shown embodiment, the stack comprises an electrically conductive material 35 over a dielectric material 34.

Electrically conductive material 35 may comprise any suitable composition or combination of compositions; and in some embodiments may comprise metal (for instance, tungsten, titanium, etc.) and/or metal-containing compositions (for instance, metal nitride, metal silicide, metal carbide, etc.).

Dielectric material 34 may comprise any suitable composition or combination of compositions; and in some embodiments may comprise, consist essentially of, or consist of non-oxygen-containing material, such as, for example, silicon nitride. In some embodiments, dielectric material 34 may comprise two or more discrete compositions. For instance, dielectric material 34 may comprise an oxygen-containing material (for instance, silicon dioxide) entirely surrounded by a liner of non-oxygen-containing material (for instance, silicon nitride). In some embodiments, material 34 may comprise, consist essentially of, or consist of an oxide, such as silicon dioxide.

The materials 34 and 35 may have any suitable thicknesses, and may be about the same thicknesses as one another, or may be substantially different thicknesses relative to one another. In some embodiments, the stack 36 has an overall thickness of from about 20 nm to about 200 nm; and the materials 34 and 35 have individual thicknesses of from about 10 nm to about 150 nm.

Figure 10:
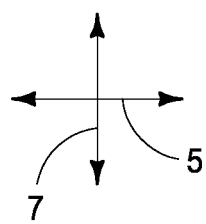
FIGS. 10-12 are a top view and cross-sectional side views of a construction at an example processing stage subsequent to that of FIGS. 7-9. The cross-sectional views of FIGS. 11 and 12 are along the lines A-A and B-B, respectively, of FIG. 10.
Figure 10:
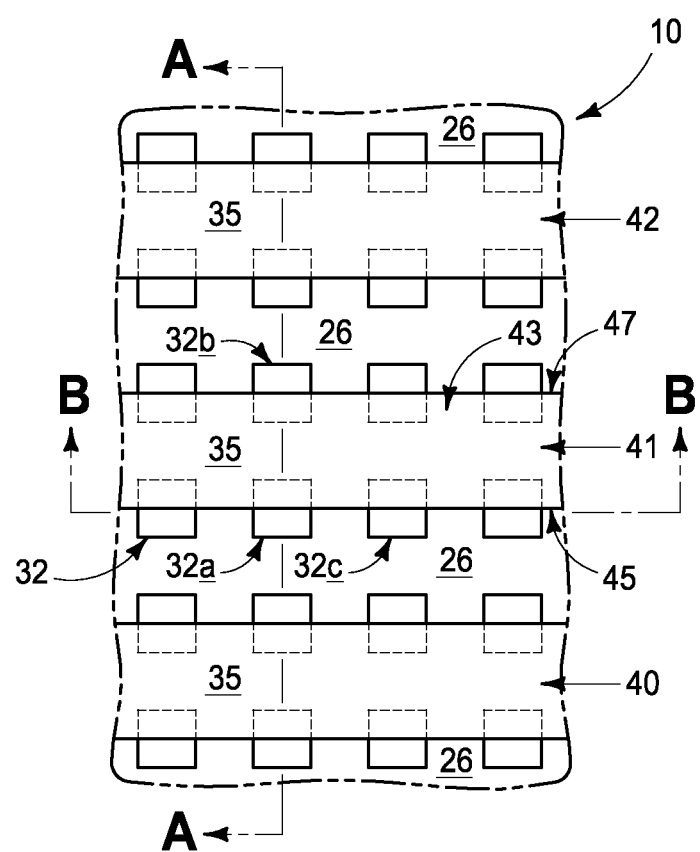
Figure 11:
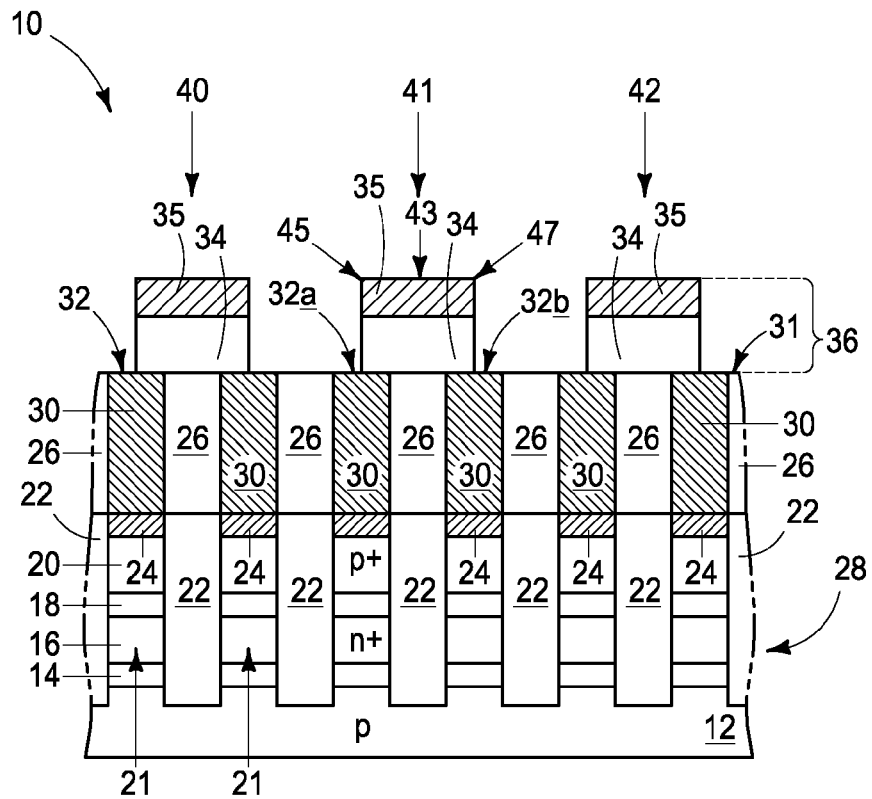
Figure 12:
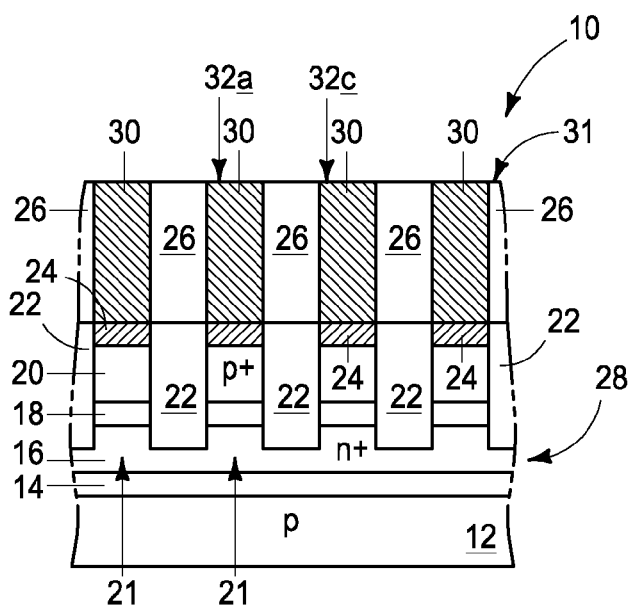

Referring to FIGS. 10-12, stack 36 is patterned into a plurality of lines 40-42, with the lines extending along the direction of axis 5. The patterning of lines 40-42 may be accomplished with any suitable processing. For instance, a patterned mask (not shown) may be formed over stack 36 to define locations of lines 40-42, subsequently a pattern may be transferred from the mask through materials 35 and 34 to create the lines 40-42, and then the mask may be removed to leave the construction of FIGS. 10-12. The patterned mask may comprise any suitable mask, and in some example embodiments may comprise photolithographically-patterned photoresist and/or masking materials patterned through pitch multiplication methodologies. The etching through materials 35 and 34 may comprise any suitable methodology. In some example embodiments, material 34 comprises silicon nitride and material 35 comprises tungsten. In such example embodiments, the etching may comprise a first dry etch through the tungsten to form a hard mask over the silicon nitride, followed by a second dry etch through the silicon nitride. The etching of materials 34 and 35 may be followed with a cleaning step to remove polymer, carbon, oxides, etc. that may have formed as a byproduct of the etching.

Each of the lines 40-42 comprises a top (for instance, the top 43 of line 41) and a pair of opposing sidewall surfaces (for instance, the sidewall surfaces 45 and 47 of line 41). In some embodiments, one of the sidewall surfaces of a line may be referred to as a first sidewall surface and the other may be referred to as a second sidewall surface. Accordingly, in some embodiments the sidewall surfaces 45 and 47 may be referred to as a first sidewall surface and a second sidewall surface, respectively. The first sidewall surface 45 passes across and directly over one set of nodes, and the second sidewall surface 47 passes across and directly over a different set of nodes. In some embodiments, the nodes under the first sidewall surface may be referred to as a first set of nodes, and the nodes under the second sidewall surface may be referred to as a second set of nodes. Accordingly, node 32a may be considered to be part of a first set of nodes, and node 32b may be considered to be part of a second set of nodes.

The lines 40-42 span spaces between the nodes 32 and partially overlap the nodes. Portions of the nodes are shown in dashed-line in the top view of FIG. 10 to indicate that such portions are under the lines 40-42.

Figure 13:
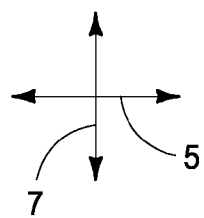
FIGS. 13-15 are a top view and cross-sectional side views of a construction at an example processing stage subsequent to that of FIGS. 10-12. The cross-sectional views of FIGS. 14 and 15 are along the lines A-A and B-B, respectively, of FIG. 13.
Figure 13:
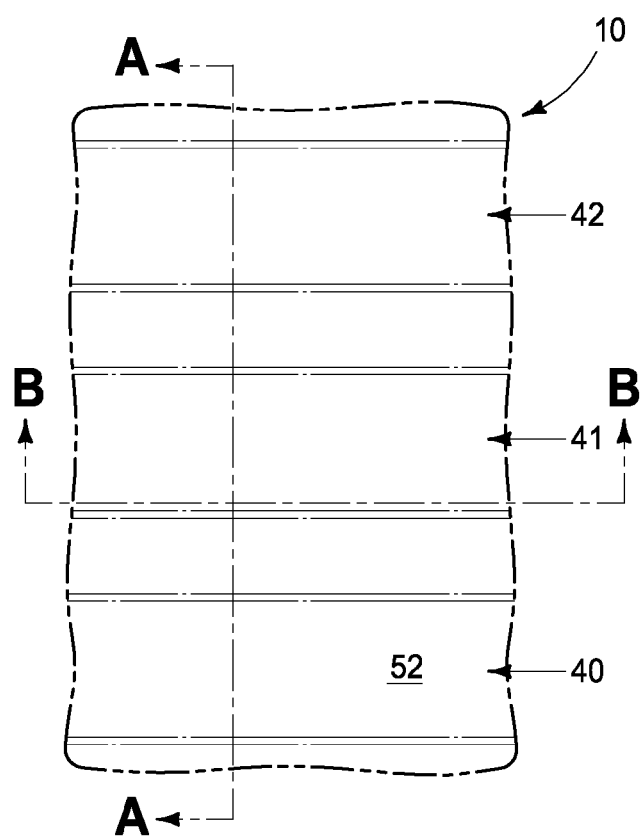
Figure 14:
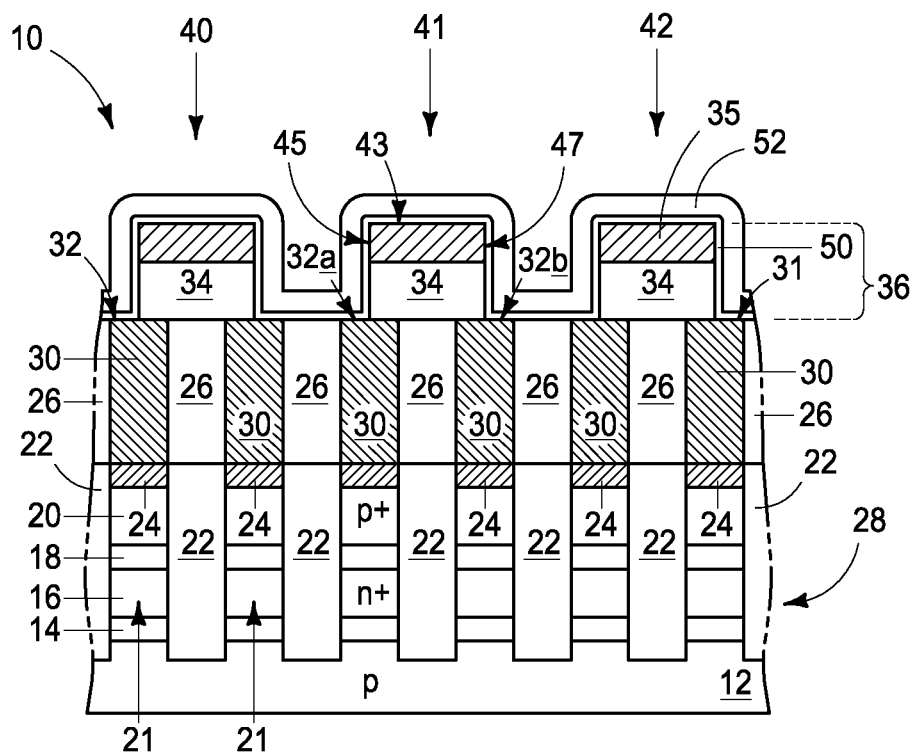
Figure 15:
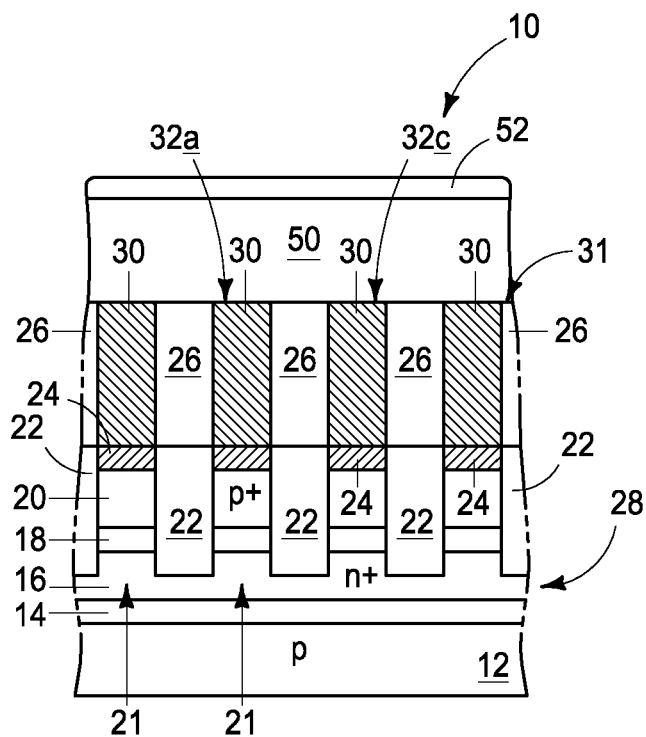

Referring to FIGS. 13-15, programmable material 50 is formed across the lines 40-42 and within gaps between the lines. The programmable material may be phase change material, and in some embodiments may comprise, consist essentially of, or consist of a chalcogenide; such as, for example, a mixture of germanium, antimony and tellurium (i.e., a mixture commonly referred to as GST). The programmable material may be an oxygen-sensitive material in some embodiments; with the term "oxygen-sensitive material" meaning a material which is altered in a non-desired manner upon exposure to oxygen. In some embodiments, the programmable material is a variable resistance resistive material having two or more stable and selectable states of different resistance relative to one another. In some embodiments, the programmable material may be replaced with a resistive material, which may or may not be a variable resistance resistive material.

The programmable material 50 is shown to extend along the exterior surfaces of lines 40-42, and specifically extends along the sidewall surfaces and top surfaces of such lines (for instance, surfaces 43, 45 and 47 of line 41). The programmable material 50 is along and directly against dielectric material 34 and conductive material 35 along sidewall surfaces of stack 36.

The programmable material 50 may have any suitable thickness, and in some embodiments may have a thickness within a range of from about 5 nanometers to about 10 nanometers. The programmable material 50 may be formed with any suitable processing; including, for example, one or more of atomic layer deposition (ALD), chemical vapor deposition (CVD) and physical vapor deposition (PVD). In some embodiments, programmable material 50 may be referred to as a sheet or film formed across the lines 40-42, and across the spaces between such lines.

Dielectric material 52 is formed over the programmable material 50. The dielectric material 52 may comprise a same composition as material 34, or may comprise a different composition relative to material 34. In some embodiments, both of materials 34 and 52 may comprise, consist essentially of, or consist of silicon nitride. In some embodiments, materials 34 and 52 may be referred to as first and second dielectric materials, respectively.

The material 52 may be formed with any suitable processing, including, for example one or more of ALD, CVD and PVD; and in some embodiments may be formed with plasma-enhanced CVD (PECVD).

In some embodiments, the processing of FIGS. 13-15 may be considered damascene processing in which programmable material 50 and dielectric material 52 are formed within trenches between lines 40-42.

Figure 16:
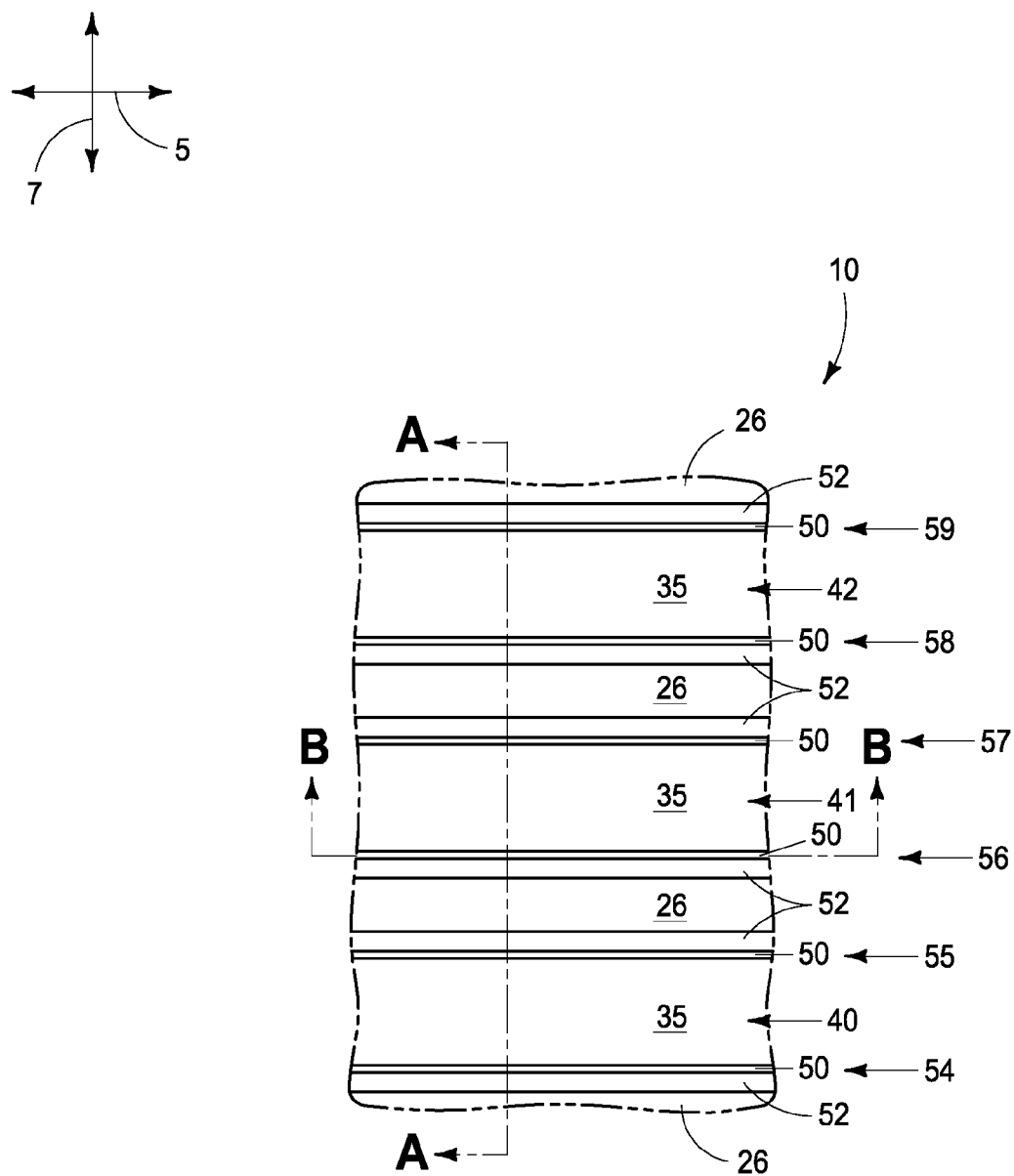
FIGS. 16-18 are a top view and cross-sectional side views of a construction at an example processing stage subsequent to that of FIGS. 13-15. The cross-sectional views of FIGS. 17 and 18 are along the lines A-A and B-B, respectively, of FIG. 16.
Figure 17:
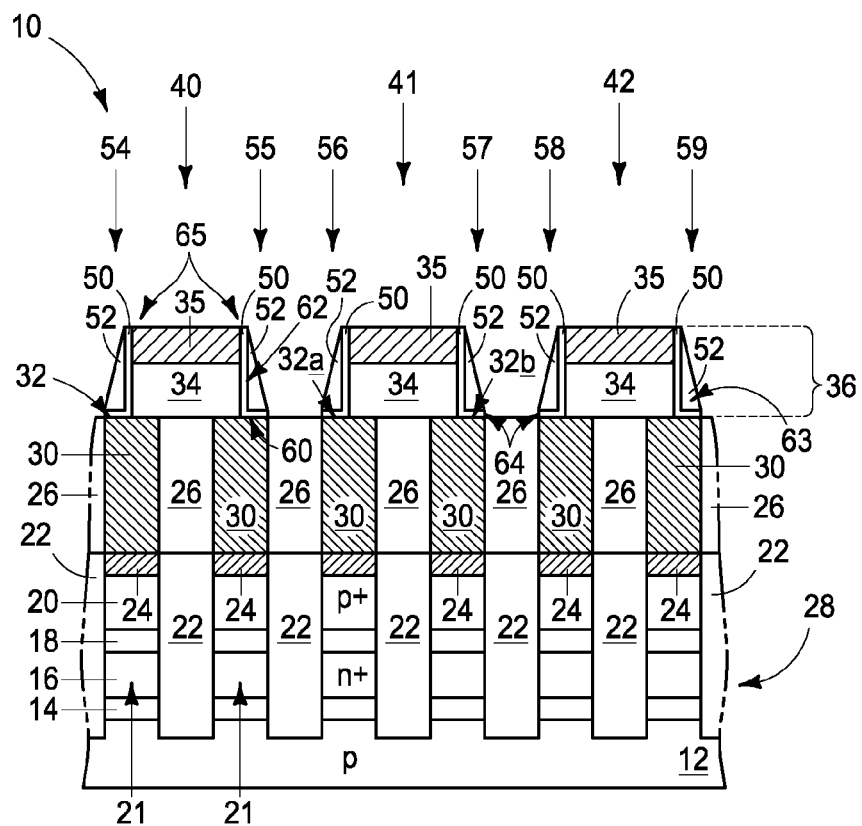
Figure 18:
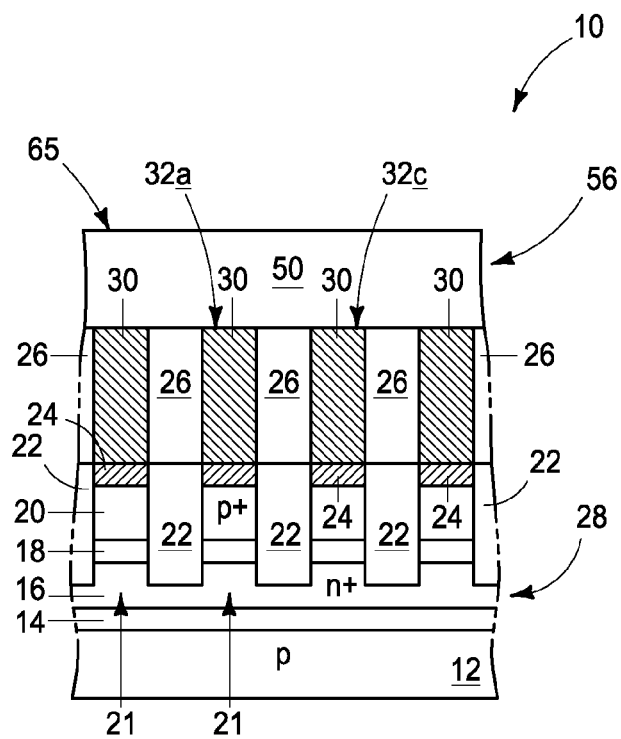

Referring to FIGS. 16-18, the materials 50 and 52 are exposed to anisotropic etching which removes the materials from over upper surfaces of lines 40-42, and from regions between the lines, while leaving the materials 50 and 52 along sidewalls of the lines. The anisotropic etching may comprise one or more dry etches followed by one or more appropriate cleaning steps.

The programmable material 50 remaining at the processing stage of FIGS. 16-18 is in the form of linear structures 54-59 extending along the sidewall surfaces of lines 40-42. Each linear structure is configured as an angled-plate having a horizontal portion 60 (one of which is labeled in FIG. 17) and a non-horizontal portion 62 (one of which is labeled in FIG. 17). The horizontal portion is over and directly against an underlying node 32, and the non-horizontal portion extends upwardly from the horizontal portion at a corner 63 (one of which is labeled in FIG. 17). In the shown embodiment, the non-horizontal portions are substantially orthogonal to the horizontal portions, and accordingly the corners are about 90°. In other embodiments, the corners may have other angles.

The horizontal portions 60 of angled plates 54-59 have exposed lateral sidewall edges 64 (only some of which are labeled) at the processing stage of FIGS. 16-18; and the non-horizontal portions 62 have exposed top edges 65 (only some of which are labeled) at such processing stage.

Figure 19:
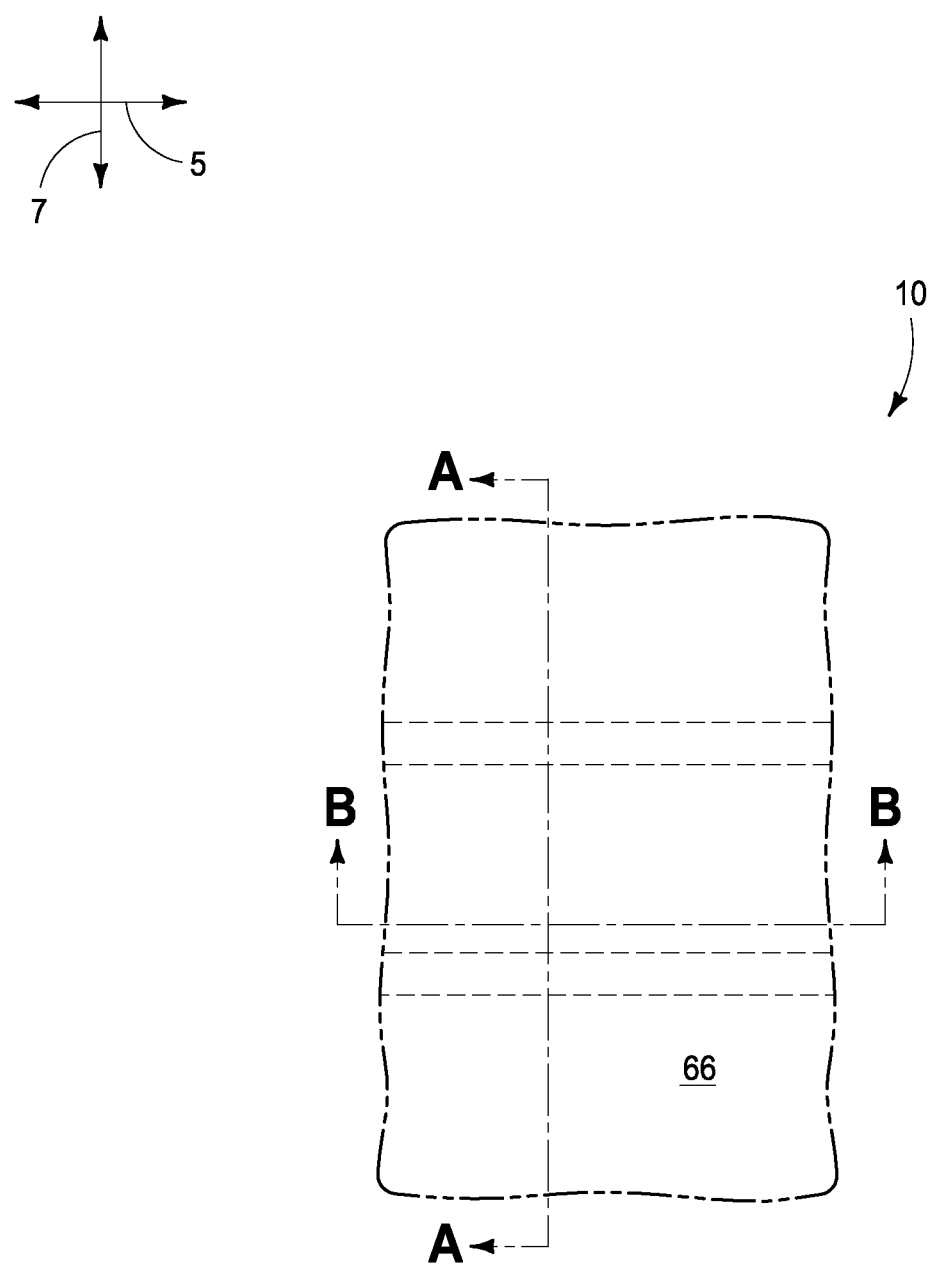
FIGS. 19-21 are a top view and cross-sectional side views of a construction at an example processing stage subsequent to that of FIGS. 16-18. The cross-sectional views of FIGS. 20 and 21 are along the lines A-A and B-B, respectively, of FIG. 19.
Figure 20:
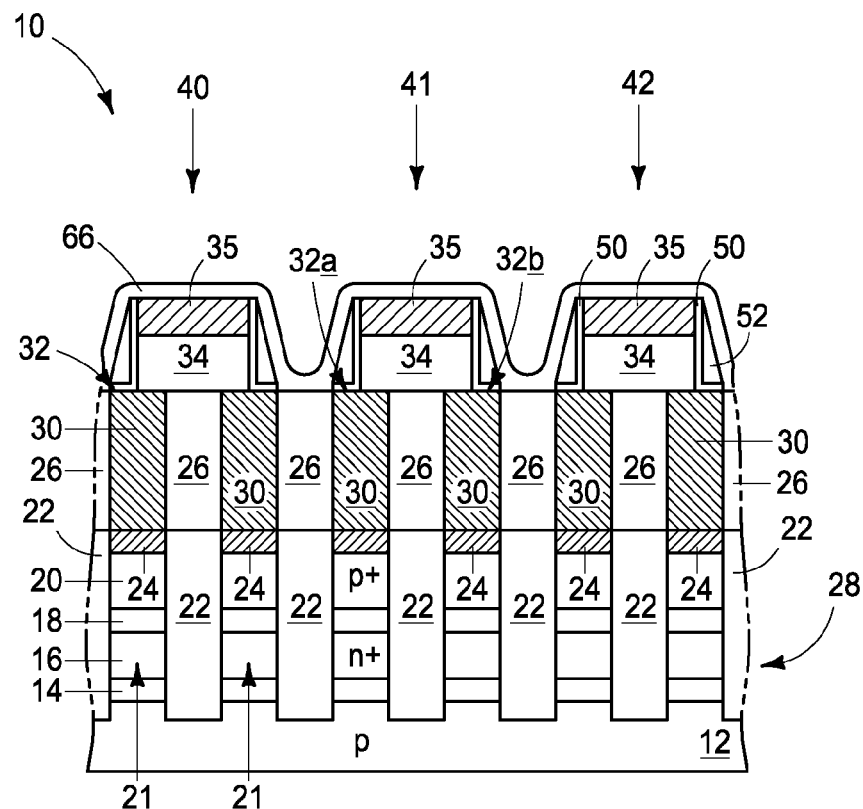
Figure 21:
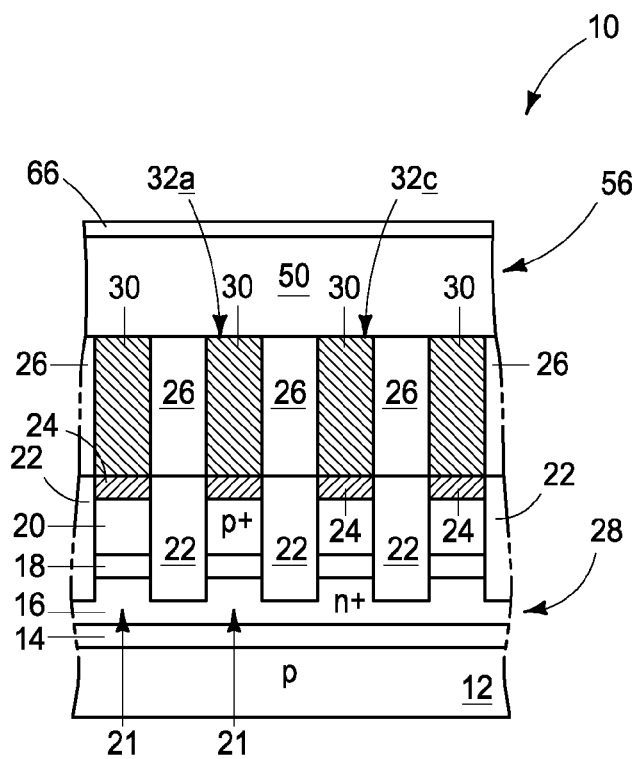

Referring to FIGS. 19-21, dielectric material 66 is formed over and between lines 40-42 to cover the exposed lateral edges 64 (FIG. 17) and top edges 65 (FIG. 17) of programmable material 50. Dielectric material 66 may be referred to as a third dielectric material to distinguish it from the first and second dielectric materials 34 and 52. The dielectric materials 34, 52 and 66 may comprise a same composition as one another in some embodiments; and may, for example, all comprise silicon nitride. In other embodiments, one or more of the materials 34, 52 and 66 may differ in composition from others of the materials 34, 52 and 66.

Figure 22:
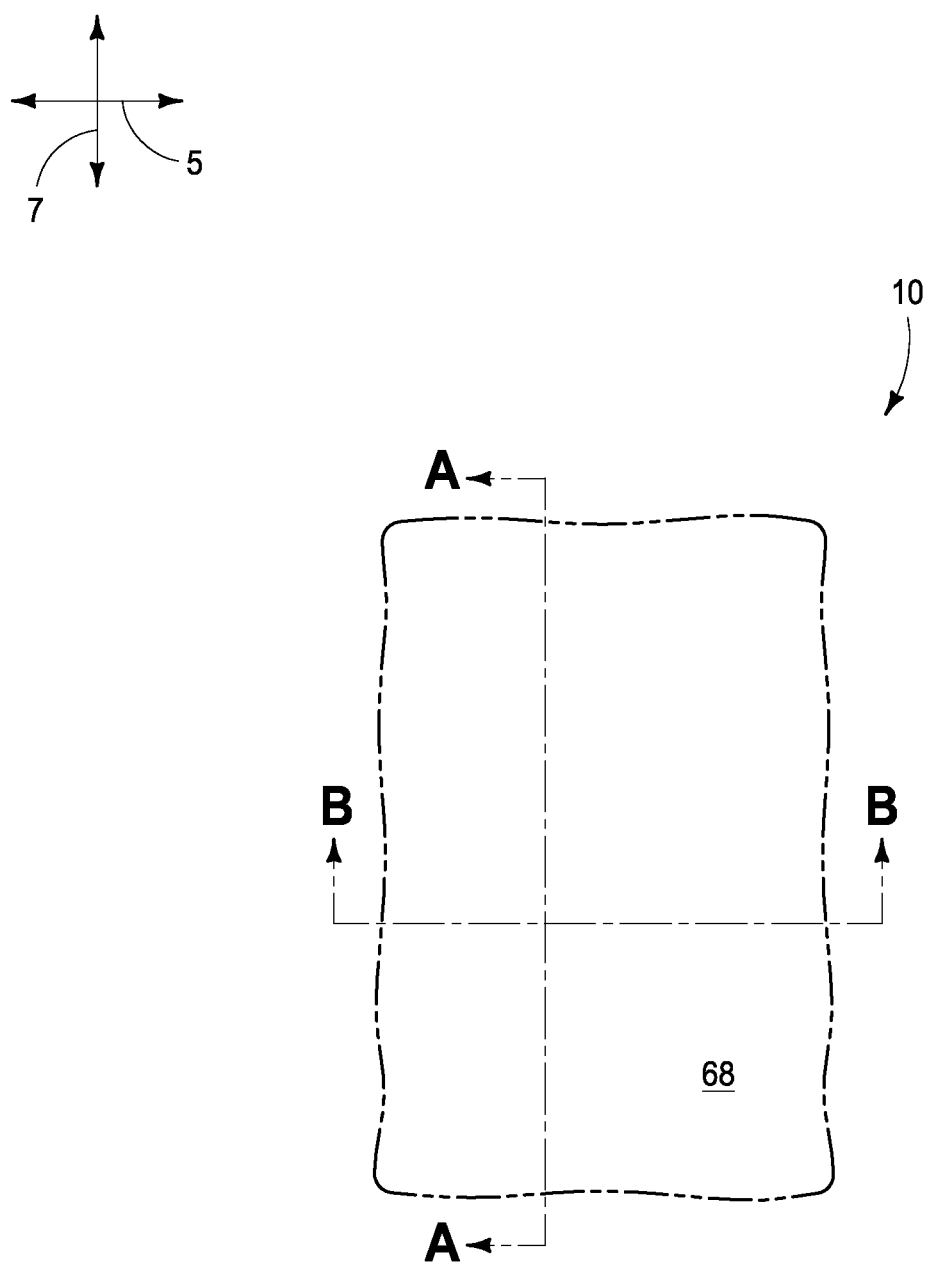
FIGS. 22-24 are a top view and cross-sectional side views of a construction at an example processing stage subsequent to that of FIGS. 19-21. The cross-sectional views of FIGS. 23 and 24 are along the lines A-A and B-B, respectively, of FIG. 22.
Figure 23:
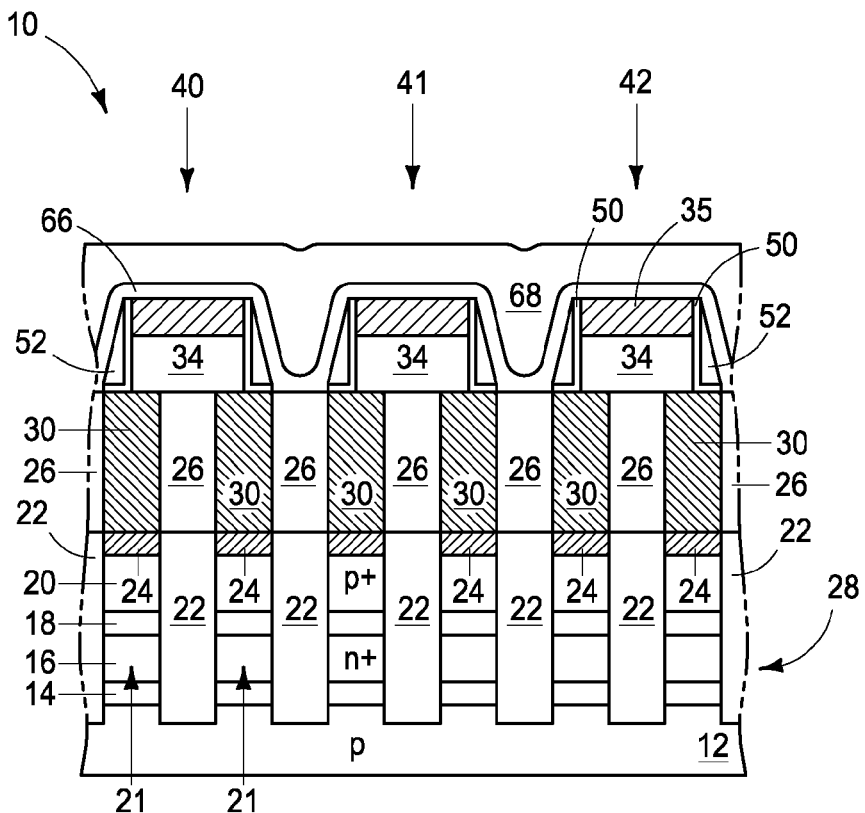
Figure 24:
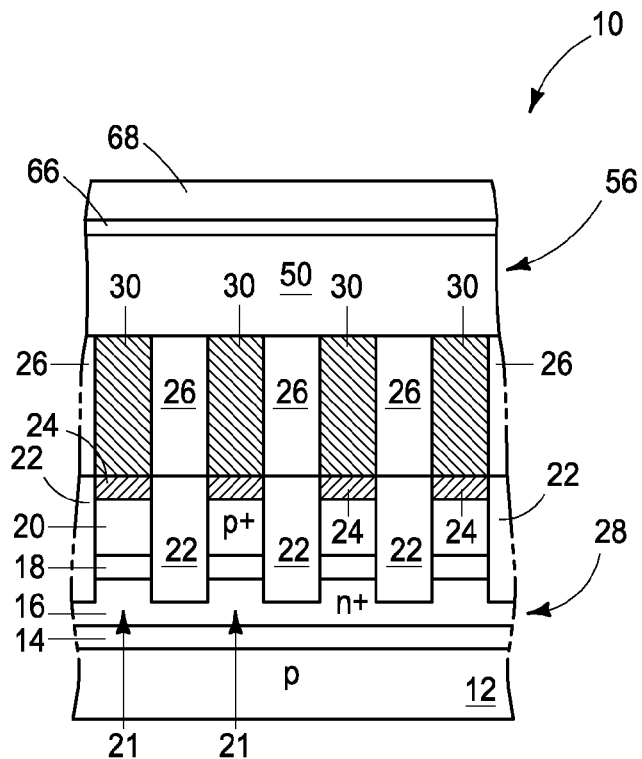

Referring to FIGS. 22-24, dielectric material 68 is formed over dielectric material 66. In some embodiments, dielectric materials 66 and 68 are a non-oxygen-containing material and an oxygen-containing material, respectively. For instance, in some embodiments dielectric material 66 may comprise, consist essentially of, or consist of silicon nitride; and the dielectric material 68 may comprise, consist essentially of, or consist of silicon dioxide (for instance, silicon dioxide formed utilizing high density plasma deposition).

Figure 25:
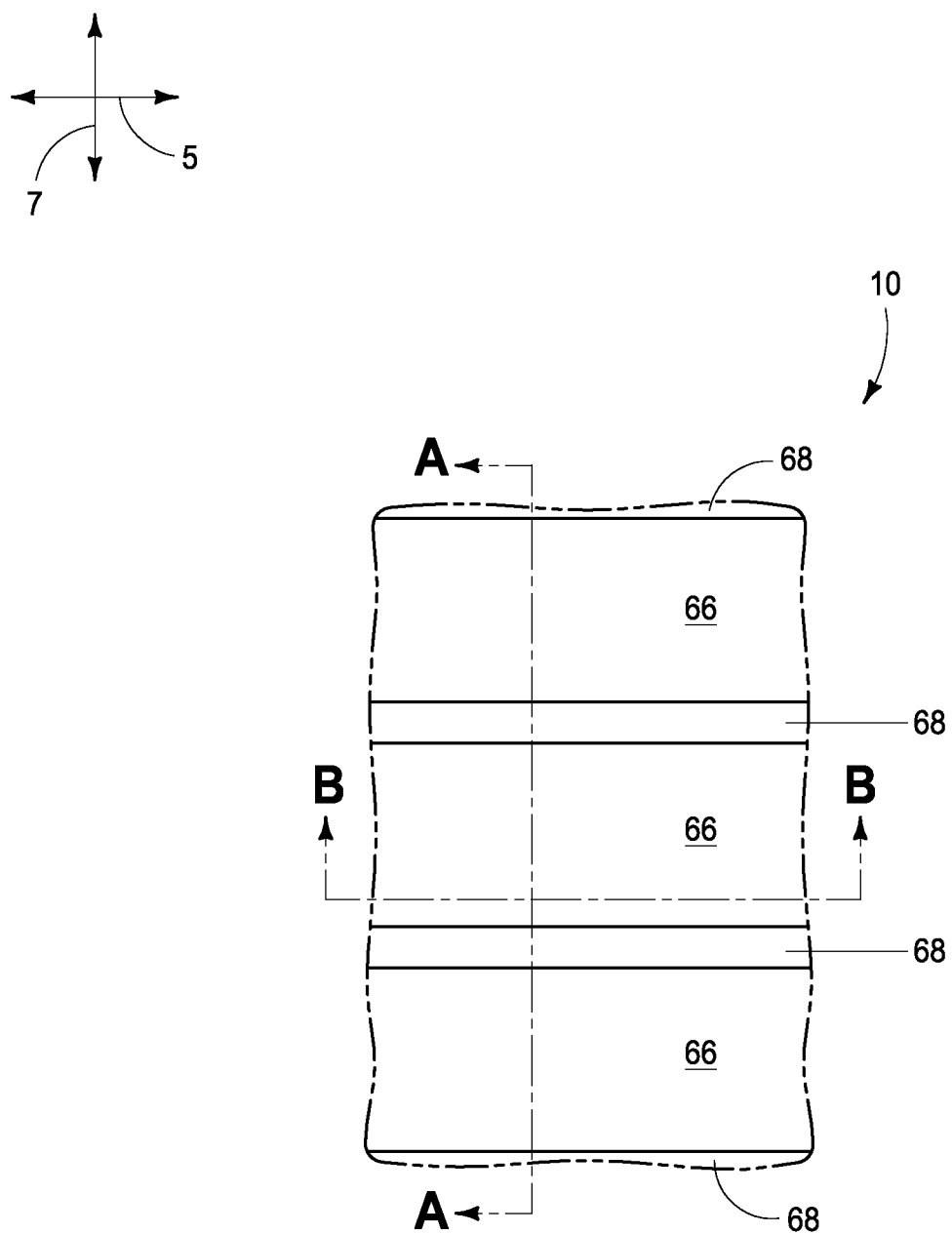
FIGS. 25-27 are a top view and cross-sectional side views of a construction at an example processing stage subsequent to that of FIGS. 22-24. The cross-sectional views of FIGS. 26 and 27 are along the lines A-A and B-B, respectively, of FIG. 25.
Figure 26:
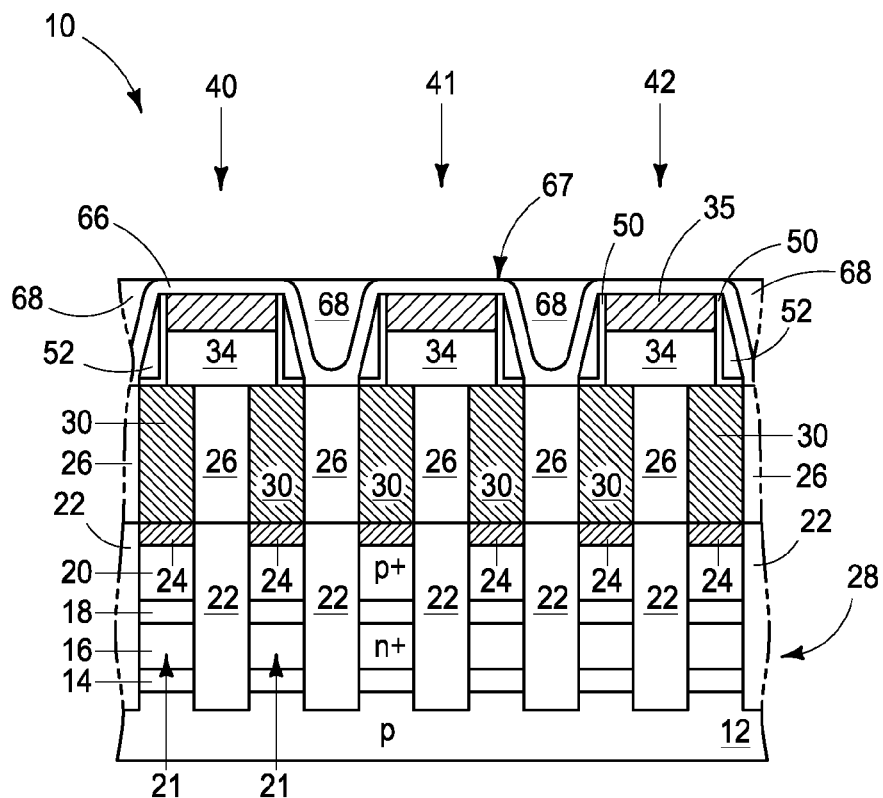
Figure 27:
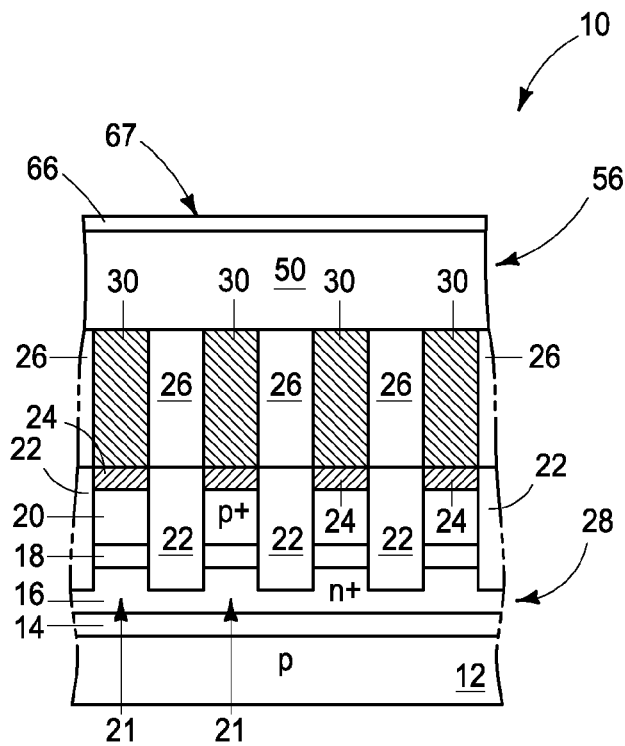

Referring to FIGS. 25-27, CMP or other suitable planarization is utilized to remove material 68 from over material 66 and form the shown planarized surface 67.

Figure 28:
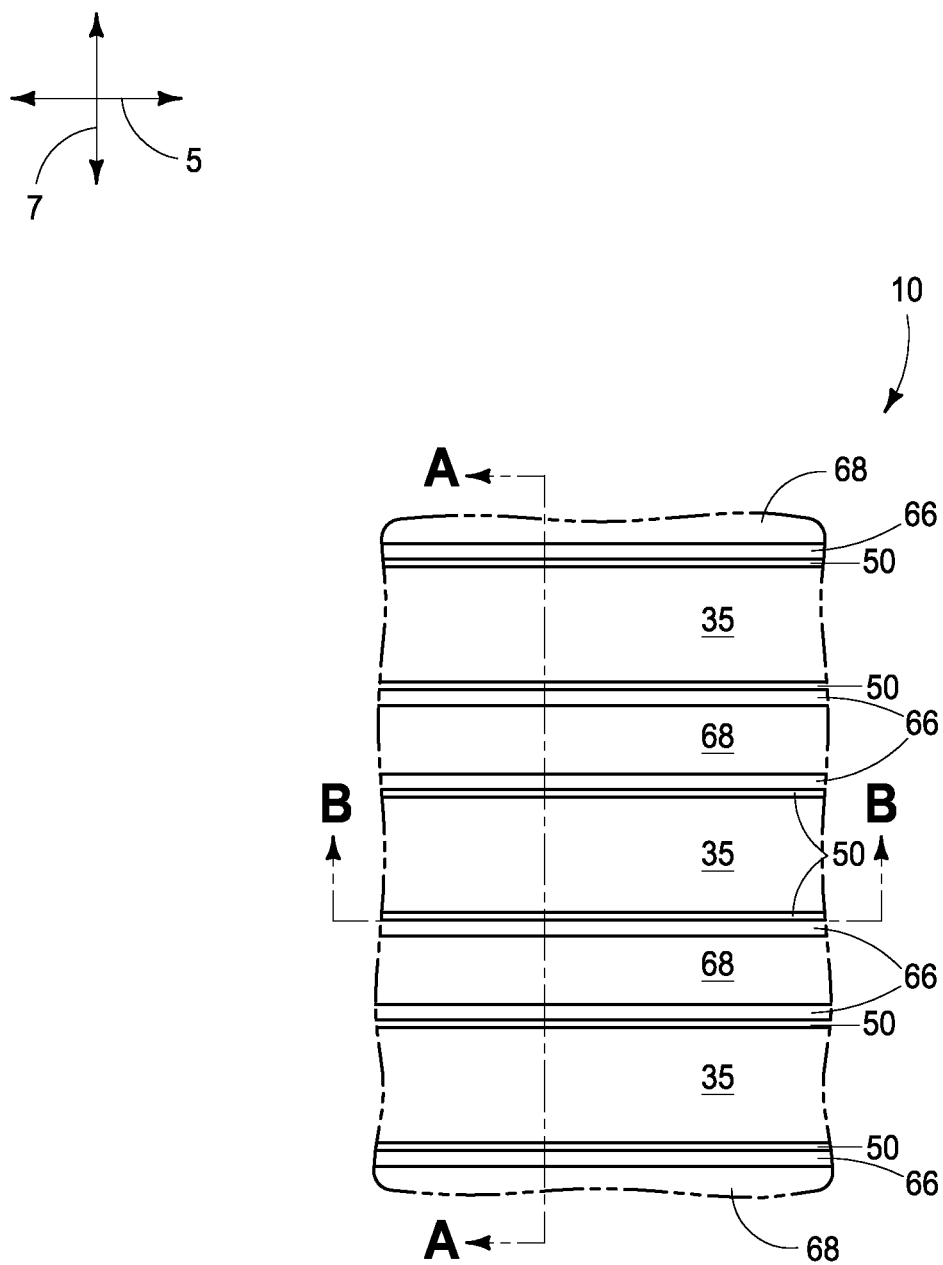
FIGS. 28-30 are a top view and cross-sectional side views of a construction at an example processing stage subsequent to that of FIGS. 25-27. The cross-sectional views of FIGS. 29 and 30 are along the lines A-A and B-B, respectively, of FIG. 28.
Figure 29:
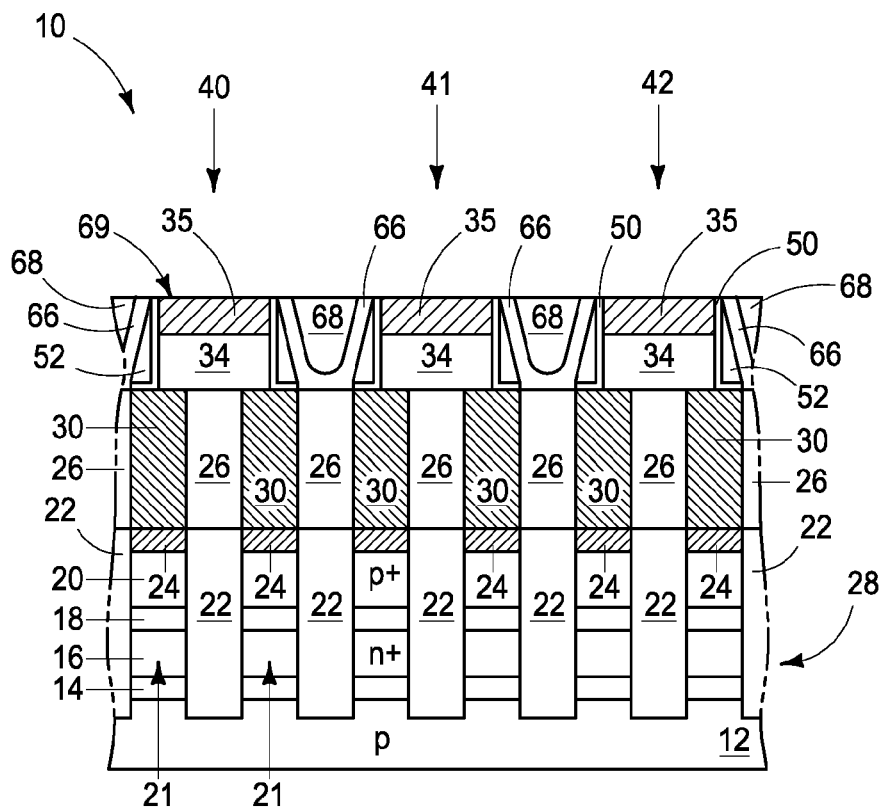
Figure 30:
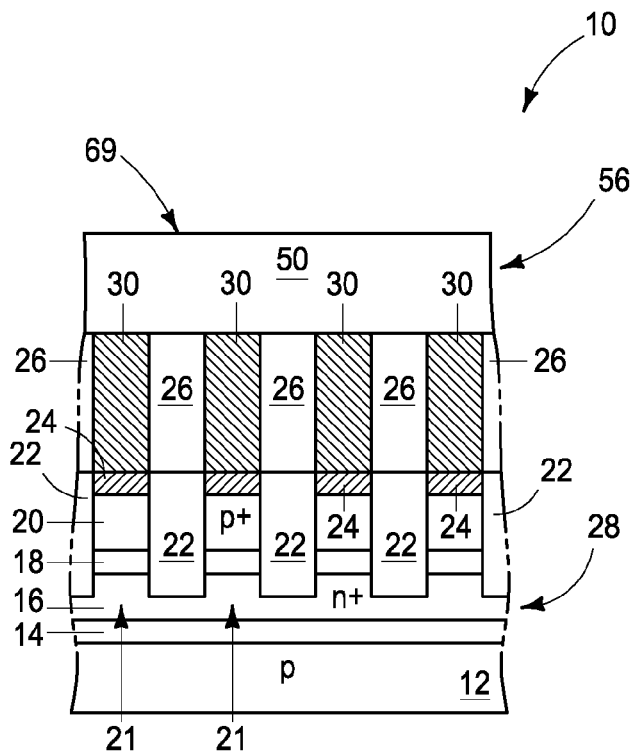

Referring to FIGS. 28-30, dielectric material 66 is removed from over conductive material 35 with suitable etching. For instance, in some embodiments dielectric material 66 may comprise silicon nitride, and may be removed from over the metal-containing material 35 utilizing CMP and/or suitable dry etching. In the shown embodiment, removal of material 66 from over conductive material 35 is conducted with processing which leaves a planarized upper surface 69 extending across conductive material 35, programmable material 50, and the dielectric materials 66 and 68.

Figure 31:
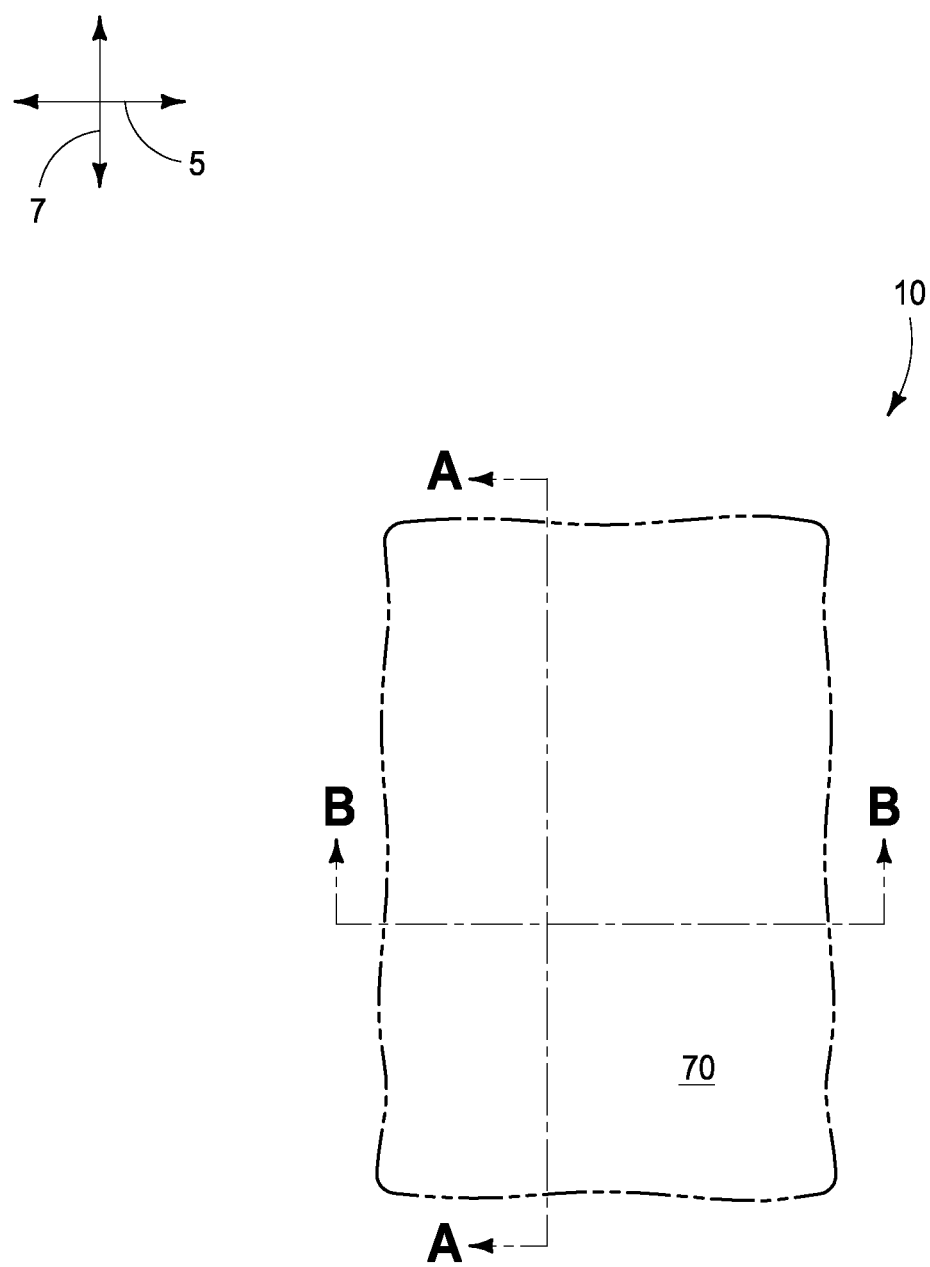
FIGS. 31-33 are a top view and cross-sectional side views of a construction at an example processing stage subsequent to that of FIGS. 28-30. The cross-sectional views of FIGS. 32 and 33 are along the lines A-A and B-B, respectively, of FIG. 31.
Figure 32:
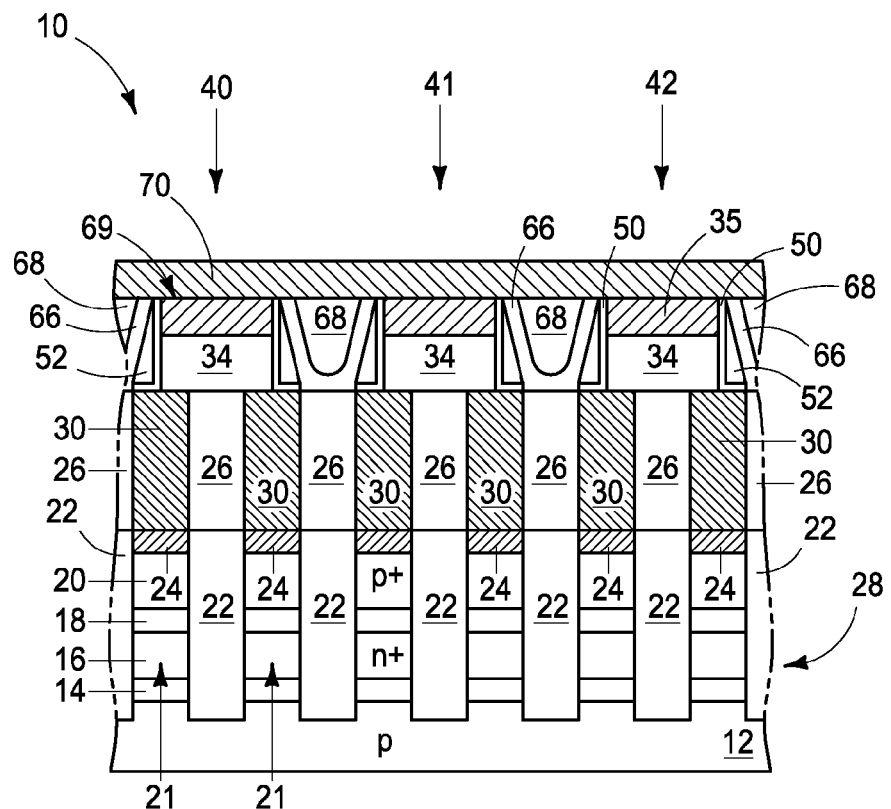
Figure 33:
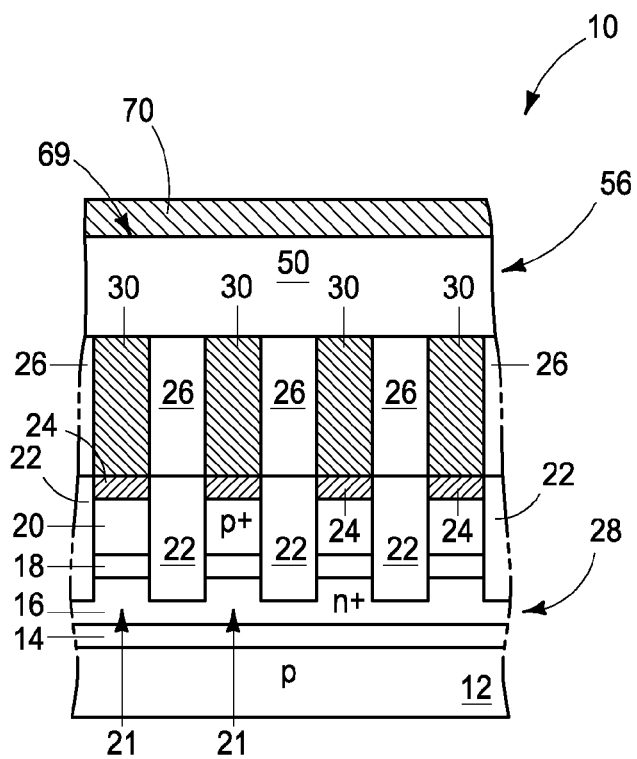

Referring to FIGS. 31-33, electrically conductive material 70 is formed across planarized surface 69. The electrically conductive material 70 is directly against conductive material 35, and also is directly against an upper edge of the programmable material 50. In some embodiments, the electrically conductive material 70 may be considered to be directly electrically coupled with electrically conductive material 35. In some embodiments, upper edges of the programmable material 50 may be recessed through etching and/or other processing, and the conductive material 70 may not be in direct contact with upper edges of the programmable material.

Electrically conductive material 70 may comprise any suitable composition or combination of compositions; and may, for example, comprise, consist essentially of, or consist of one or more of various metals, metal-containing compositions, and conductively-doped semiconductor materials. In some embodiments, electrically conductive materials 35 and 70 may be referred to as first and second electrically conductive materials, respectively. Such first and second electrically conductive materials may comprise a same composition as one another in some embodiments, and may comprise different compositions relative to one another in other embodiments. In some embodiments, nodes 32 form lower electrodes of memory cells, and conductive material 70 is utilized to form upper electrodes of the memory cells (as discussed below with reference to FIGS. 34-36). In some example applications of such embodiments, the conductive material 70 may comprise a same composition as the upper surfaces of nodes 32, and in other example applications of such embodiments the conductive material 70 may comprise a different composition than the upper surfaces of nodes 32.

Figure 34:
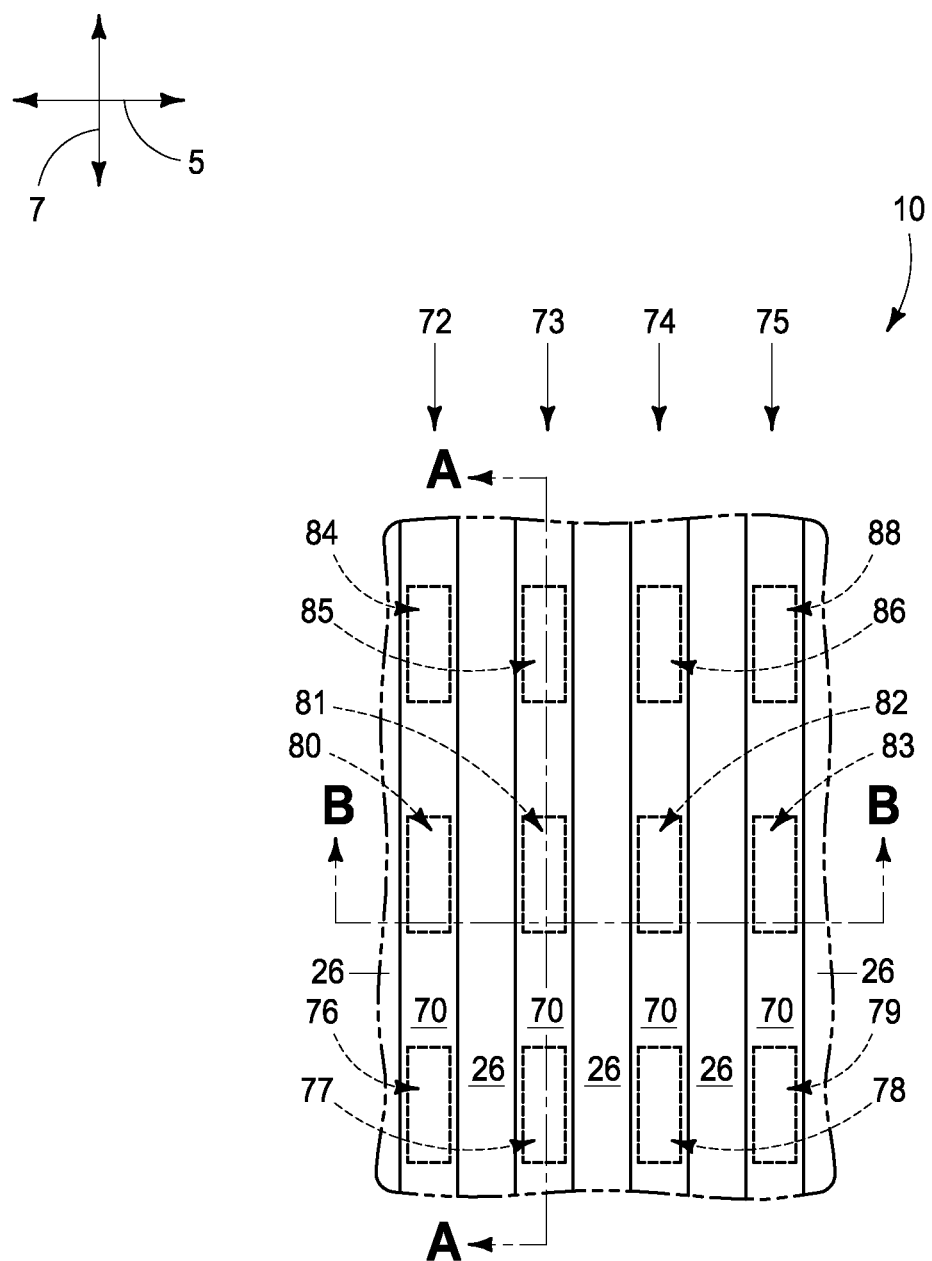
FIGS. 34-36 are a top view and cross-sectional side views of a construction at an example processing stage subsequent to that of FIGS. 31-33. The cross-sectional views of FIGS. 35 and 36 are along the lines A-A and B-B, respectively, of FIG. 34.
Figure 35:
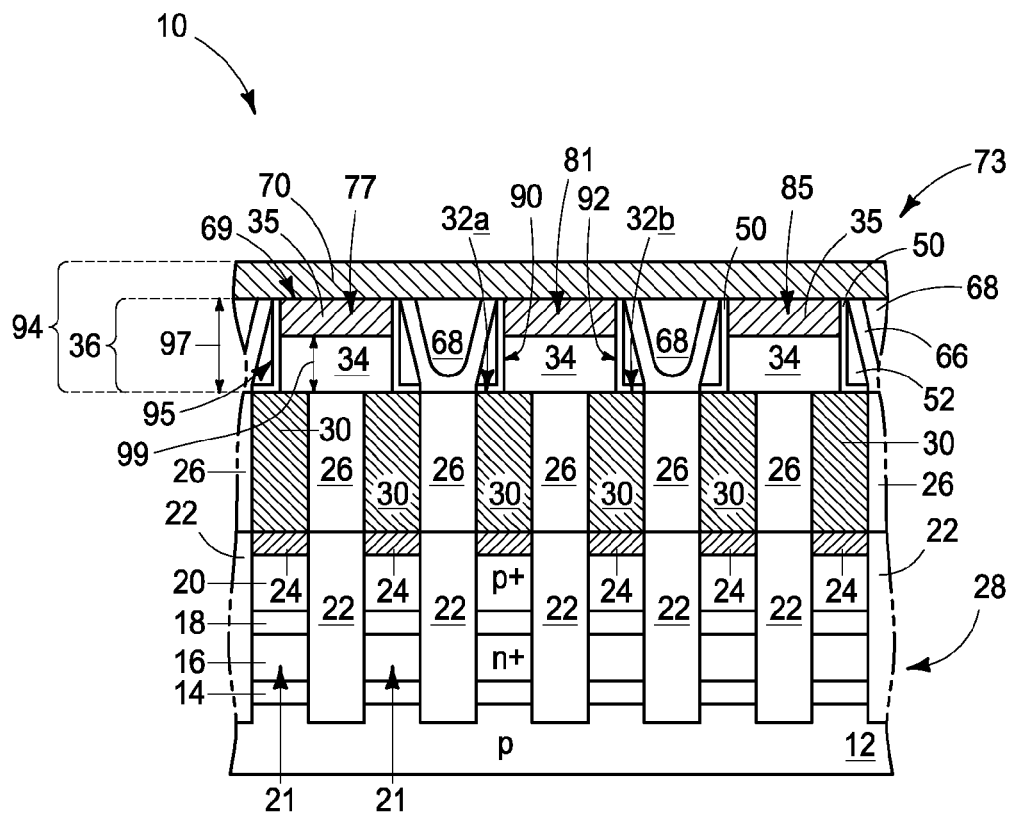
Figure 36:
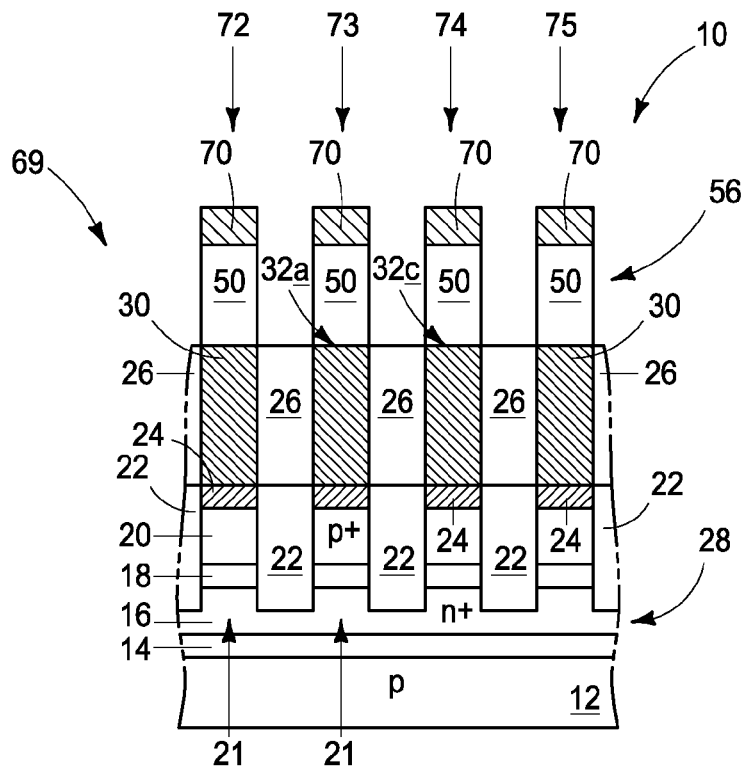

Referring to FIGS. 34-36, the second electrically conductive material 70 is patterned into lines 72-75 extending along the direction of axis 7. In some embodiments, the lines 40-42 (FIGS. 10-12) may be considered to be a first series of lines, and the lines 72-75 may be considered to be a second series of lines. The second series of lines extend along a direction which intersects a direction of the first series of lines, and in the shown embodiment the second series of lines are substantially orthogonal to the first series of lines. The lines 72-75 may be considered to be bitlines extending along the columns of the two-dimensional array described above with reference to FIGS. 4-6 in some embodiments.

The pattern of lines 72-75 is transferred into the materials 34, 35, 50, 52, 66 and 68 underlying such lines. The transfer of the pattern of lines 72-75 into materials 34 and 35 of stack 36 patterns such materials into blocks 76-88, which are shown in dashed-line view in FIG. 34 to indicate that such blocks are under the material 70. In some embodiments, the blocks 76-88 may be considered to be bridging structures which bridge pairs of nodes to one another. For instance, the bridging structure 81 is shown in FIG. 35 to bridge across nodes 32a and 32b. The bridging structures are rectangular in the shown embodiment, and extend lengthwise along a direction substantially orthogonal to the direction of the wordlines underlying nodes 32 (such as, for example the example wordline 28 shown in FIG. 36). In some embodiments, the blocks 76-88 may be considered to be height-defining structures, which ultimately define the height of programmable regions of memory cells (as discussed below with reference to FIG. 35). In some embodiments, the blocks 76-88 may be considered to be stacks comprising electrically conductive material 35 over and directly against dielectric material 34.

FIG. 34 shows that numerous bridging structures are under each of the conductive lines 72-75 (for instance, bridging structures 76, 80 and 84 are under conductive line 72), and accordingly the conductive lines are in a one-to-many relationship with the bridging structures. FIG. 34 also shows that the bridging structures 76-88 are rectangular in the shown embodiment. In some embodiments, the illustrated bridging structures 76-88 may be considered to be linear structures which extend parallel to the axis 7, and thus which extend primarily along a same direction (i.e., the direction of axis 7) as lines 72-75 in the shown embodiment.

Programmable material 50 forms programmable material structures (which may be referred to as resistive structures in some embodiments) along sidewall surfaces of the bridging structures 76-88. For instance, programmable material 50 forms a pair of structures 90 and 92 along sidewalls of bridging structure 81, as shown in FIG. 35. The programmable material structures are configured as angled plates in the shown embodiment, with horizontal surfaces of the angled plates being directly against nodes 32, and non-horizontal surfaces (vertical surfaces in the shown embodiment) of the angled plates being directly against the materials 34 and 35 of stack 36. In some embodiments, the transfer of the pattern of lines 72-75 into material 50 may be considered to subdivide linear structures 54-59 (FIG. 16) of material 50 into a plurality of programmable material (or resistive material) structures. In some embodiments, the widths of such structures may be considered to be defined by the pattern of lines 72-75. In some embodiments the structures formed by subdividing linear structures 54-59 may be referred to as programmable material plates, or as resistive material plates.

The programmable material structures are incorporated into memory cells, with the individual programmable material structures being between a first electrode corresponding to a node 32, and a second electrode corresponding to a bottom conductive surface of one of the bitlines. Accordingly, the programmable material structures are in one-to-one correspondence with nodes 32 in the shown embodiment. In some embodiments, material 50 is phase change material, and accordingly the programmable material structures are phase change material structures (for instance, chalcogenide structures). The phase change material structure directly between a bitline and an underlying node may become the programmable material of a memory cell. In the shown embodiment, the phase change material is utilized without a heating element (i.e., is utilized in a self-heating memory cell). In other embodiments, processing analogous to that described herein may be utilized to form phase change memory which incorporates heating elements into the memory cells.

One of the memory cells shown the cross-sectional view of FIG. 35 is labeled as a memory cell 94. The programmable material structure within such memory cell is labeled as a structure 95 and has an overall height 97. However, a height of the functional region of the programmable material within the memory cell corresponds to a distance between an upper surface of the underlying node 32 and a lower surface of conductive material 35, (i.e., a distance 99 labeled in FIG. 35). The height of the functional region of the programmable material of the memory cell is defined by relative thicknesses of dielectric material 34 and conductive material 35 of structures 76-88 (FIG. 34), and thus the stacks of materials 34 and 35 may be considered height-defining structures which define the heights of the functional regions of the programmable material within the memory cells. In some embodiments, the height of the functional region of the programmable material may be considered to correspond to a thickness of dielectric material 34. In some embodiments, conductive material 35 may be considered to define a non-functional region (or portion) of the resistive material by shunting such portion of the resistive material.

An advantage of the configuration of FIG. 35 may be that the thickness of dielectric material 34 can be readily controlled across an array of memory cells, and accordingly cell-to-cell uniformity may be maintained. Another advantage of the configuration of FIG. 35 may be that if top edges of the programmable material structures within the memory cells are damaged during processing (such as, for example, during the processing of FIGS. 28-30 to form planarized upper surface 69), such damage will be distant from functional regions of the programmable material structures within the memory cells, and accordingly any significant impact of such damage is alleviated, or even prevented, as compared to prior art processing which utilizes an entirety of the height of a programmable material structure as a functional region within a memory cell.

The L-shaped programmable material structures of FIG. 34 are example programmable material structures. In other embodiments, other configurations of programmable material structures may be formed. For instance, in some embodiments the programmable material structures may be configured as pillars. FIGS. 37-48 illustrate an example embodiment for forming pillar-shaped programmable material structures. Similar numbering will be utilized for describing FIGS. 37-48 as is used for describing FIGS. 1-36, where appropriate.

Figure 37:
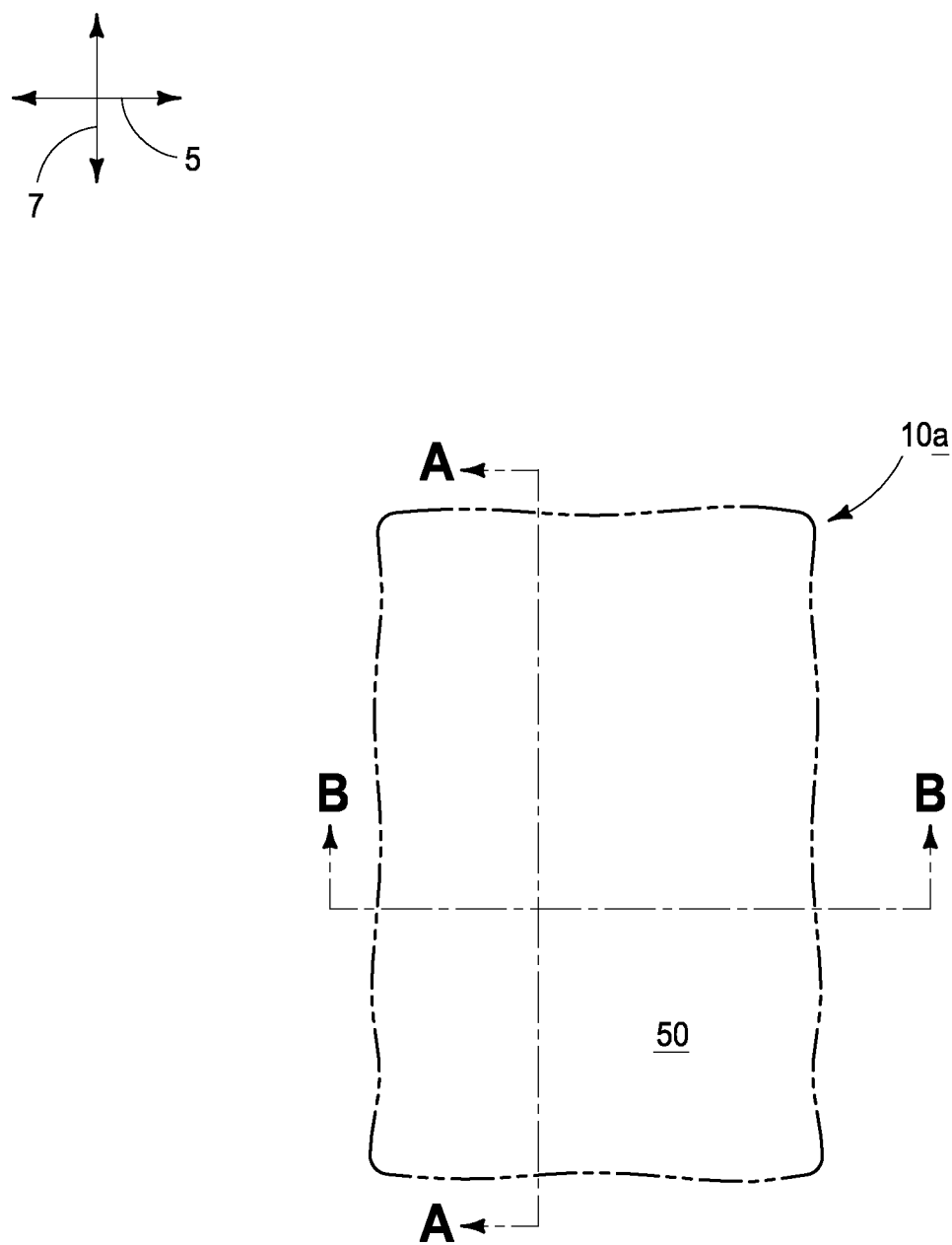
FIGS. 37-39 are a top view and cross-sectional side views of a construction at an example processing stage in accordance with another example embodiment. The cross-sectional views of FIGS. 38 and 39 are along the lines A-A and B-B, respectively, of FIG. 37. The process stage of FIGS. 37-39 may follow that of FIGS. 10-12 in some embodiments.
Figure 38:
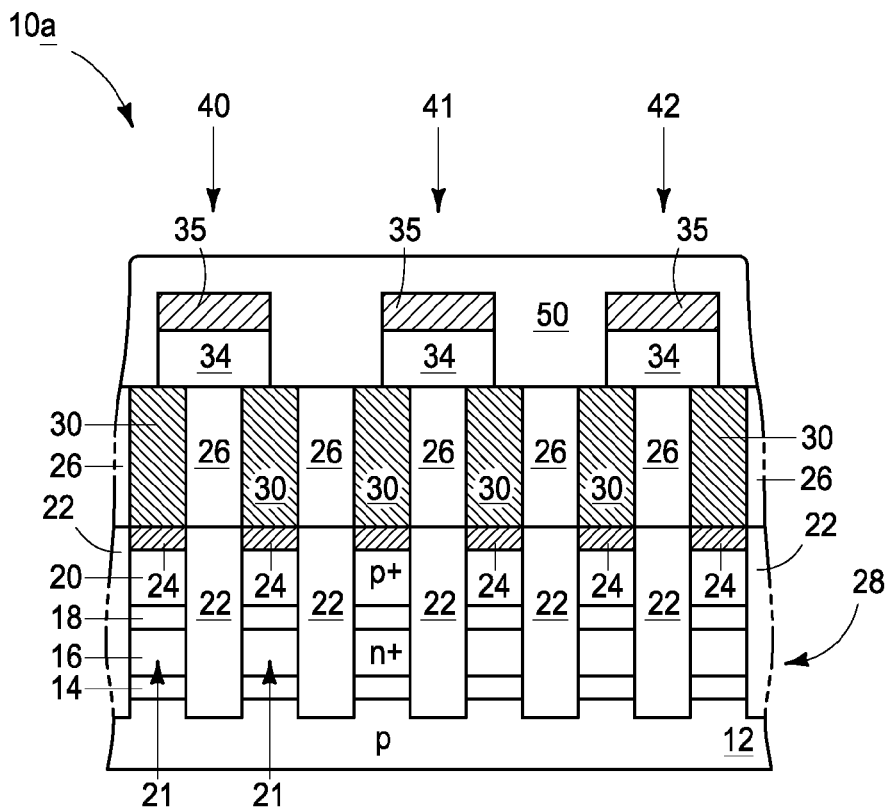
Figure 39:
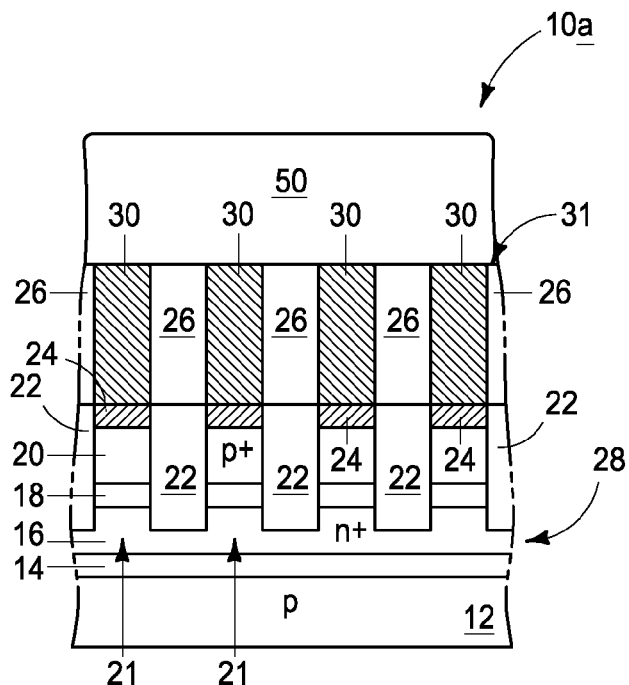

Referring to FIGS. 37-39, a construction 10a is shown at a processing stage subsequent to that of FIGS. 10-12. Programmable material 50 is formed over and between lines 40-42, with the programmable material filling gaps between the lines. In some embodiments, the processing of FIGS. 37-39 may be considered damascene processing in which programmable material 50 is formed within trenches between lines 40-42.

Figure 40:
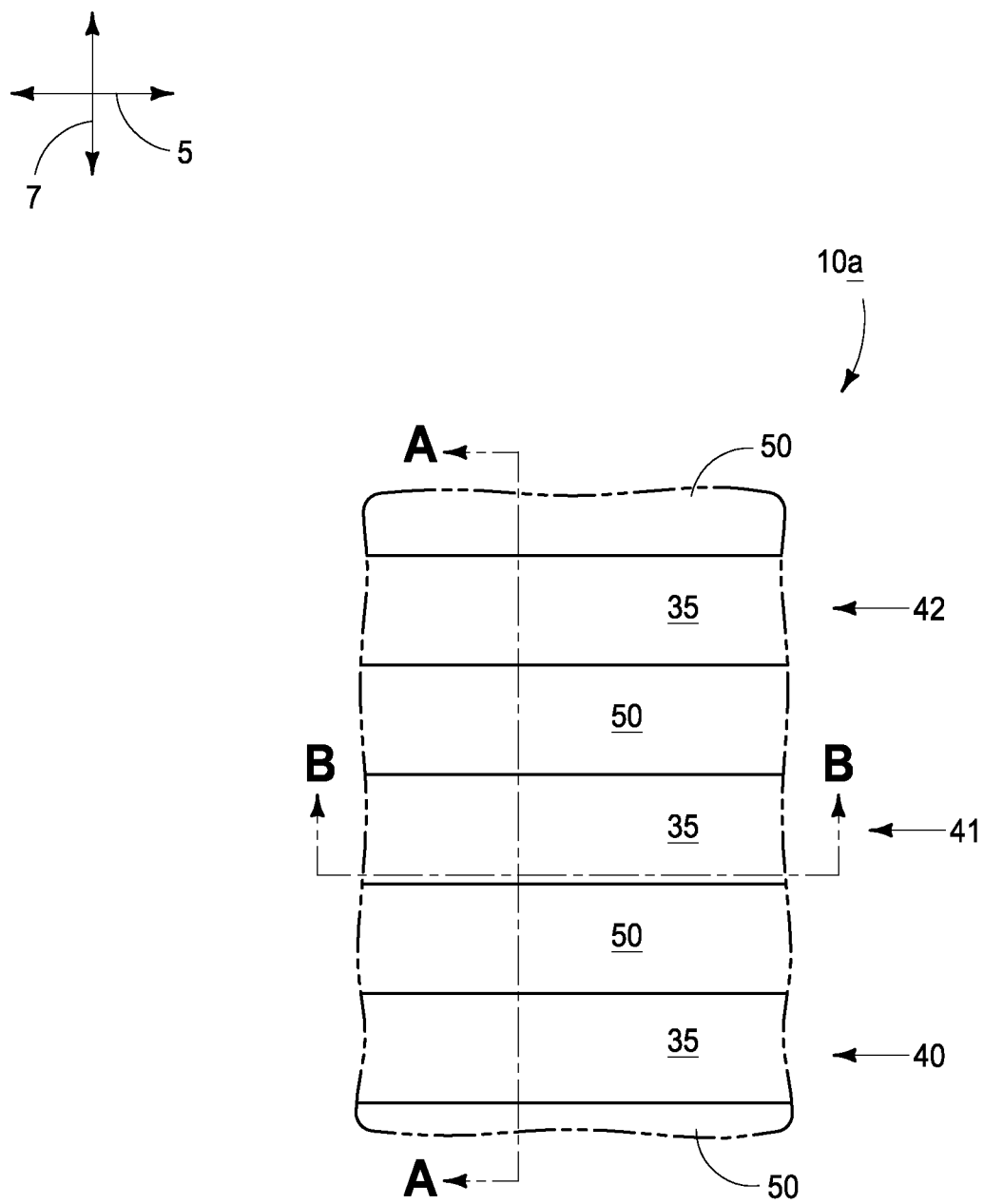
FIGS. 40-42 are a top view and cross-sectional side views of a construction at an example processing stage subsequent to that of FIGS. 37-39. The cross-sectional views of FIGS. 41 and 42 are along the lines A-A and B-B, respectively, of FIG. 40.
Figure 41:
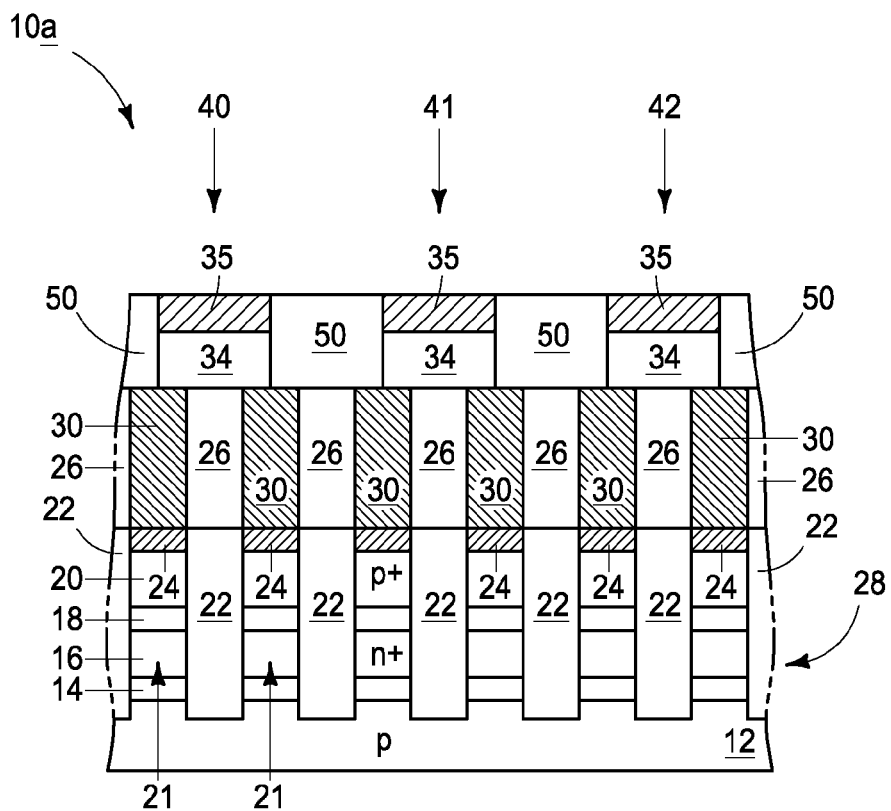
Figure 42:
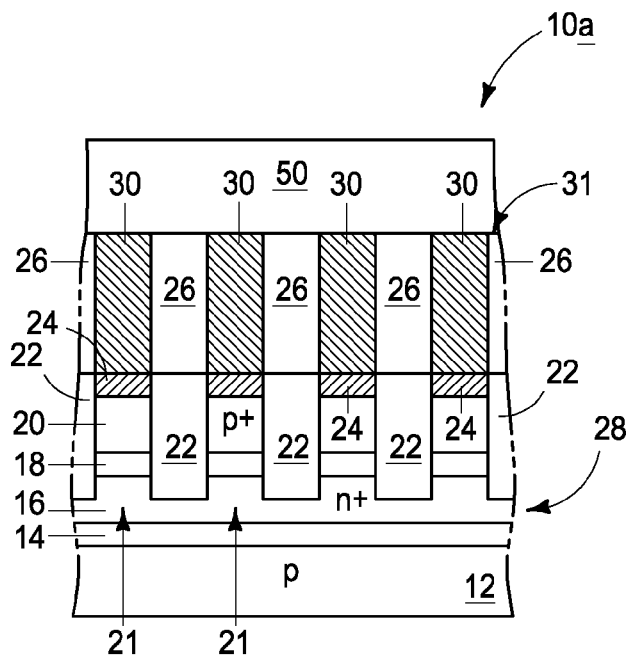

Referring to FIGS. 40-42, CMP or other suitable planarization is utilized to remove programmable material 50 from over the conductive material 35 of lines 40-42.

Figure 43:
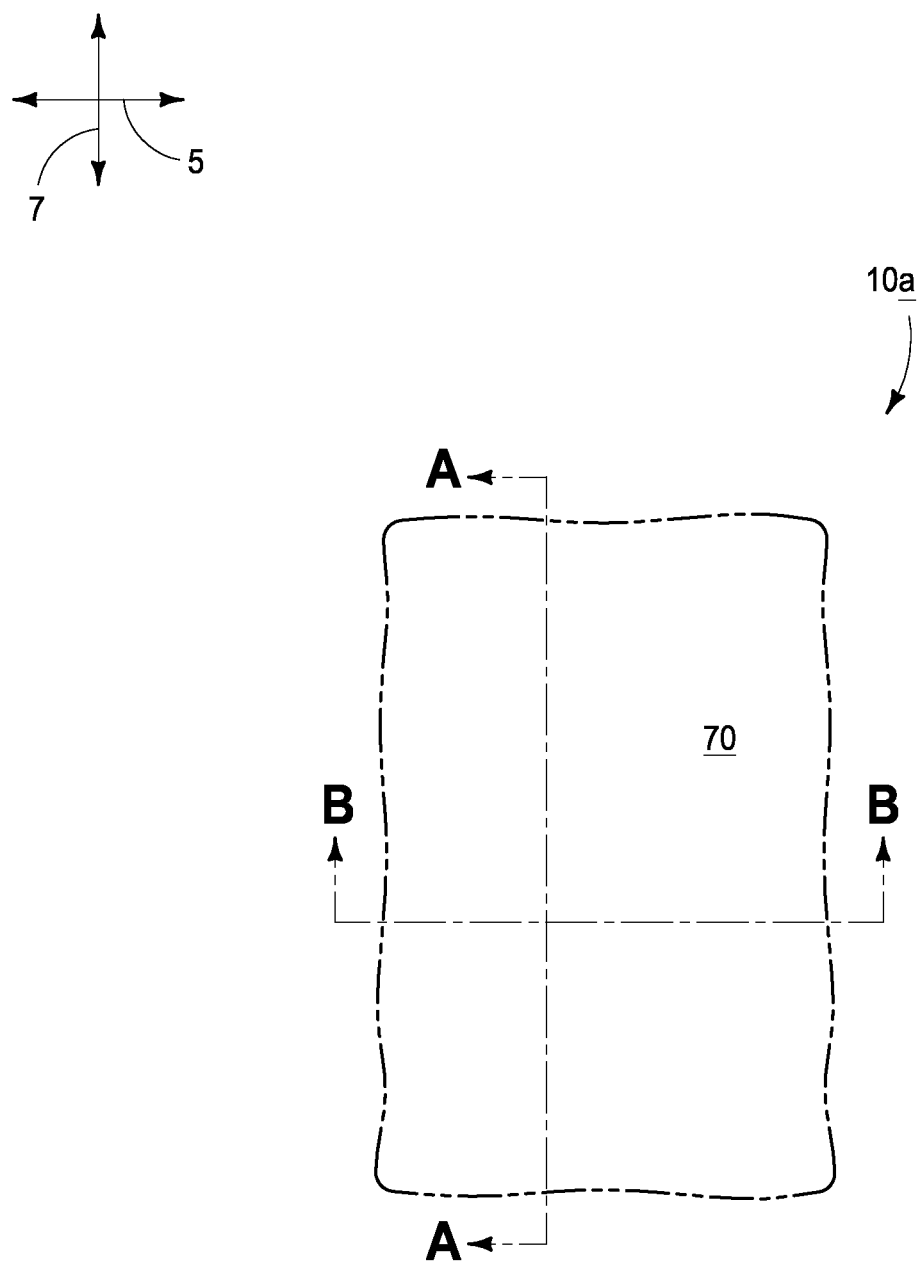
FIGS. 43-45 are a top view and cross-sectional side views of a construction at an example processing stage subsequent to that of FIGS. 40-42. The cross-sectional views of FIGS. 44 and 45 are along the lines A-A and B-B, respectively, of FIG. 43.
Figure 44:
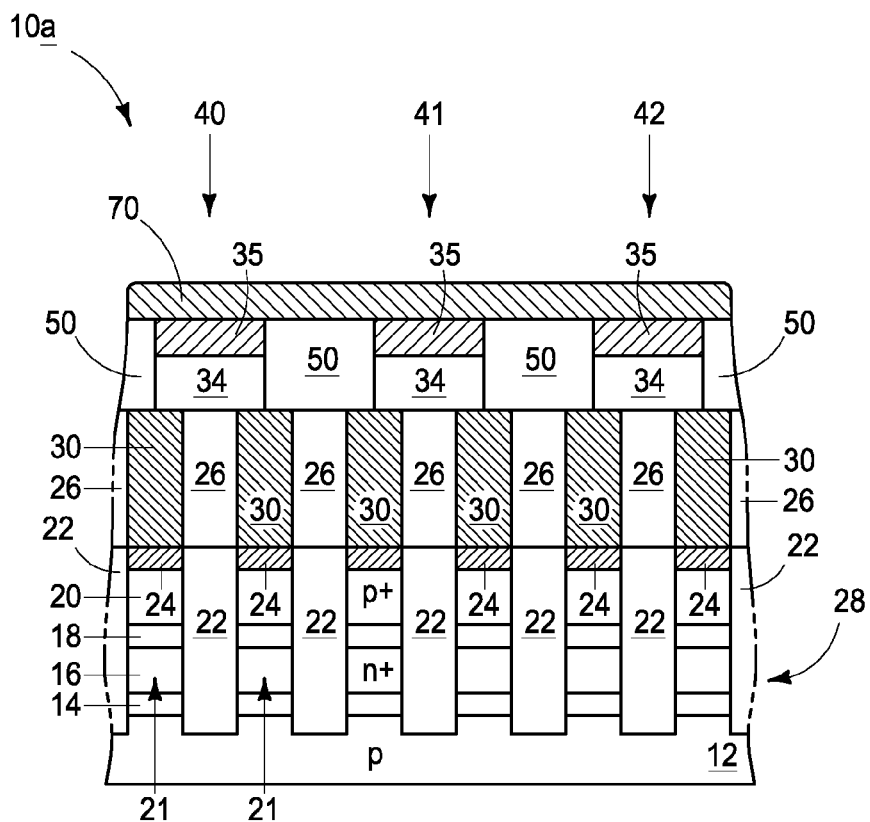
Figure 45:
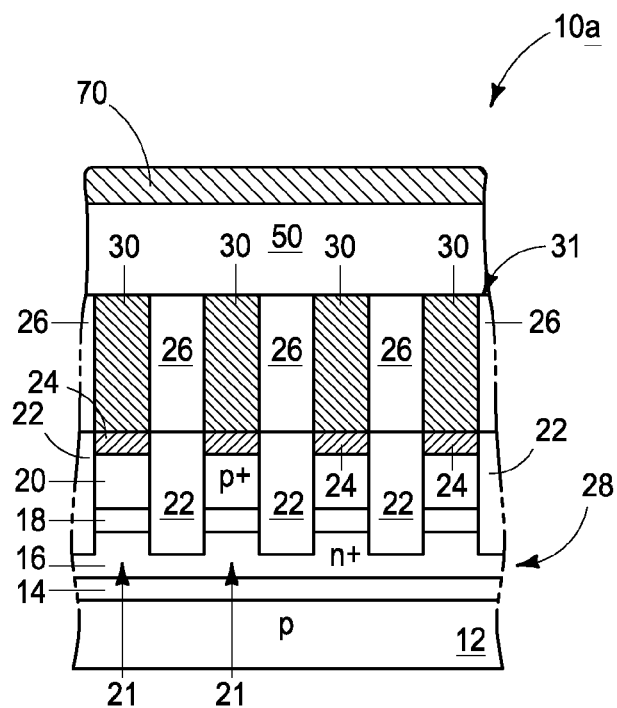

Referring to FIGS. 43-45, electrically conductive material 70 is formed across lines 40-42 and across programmable material 50.

Figure 46:
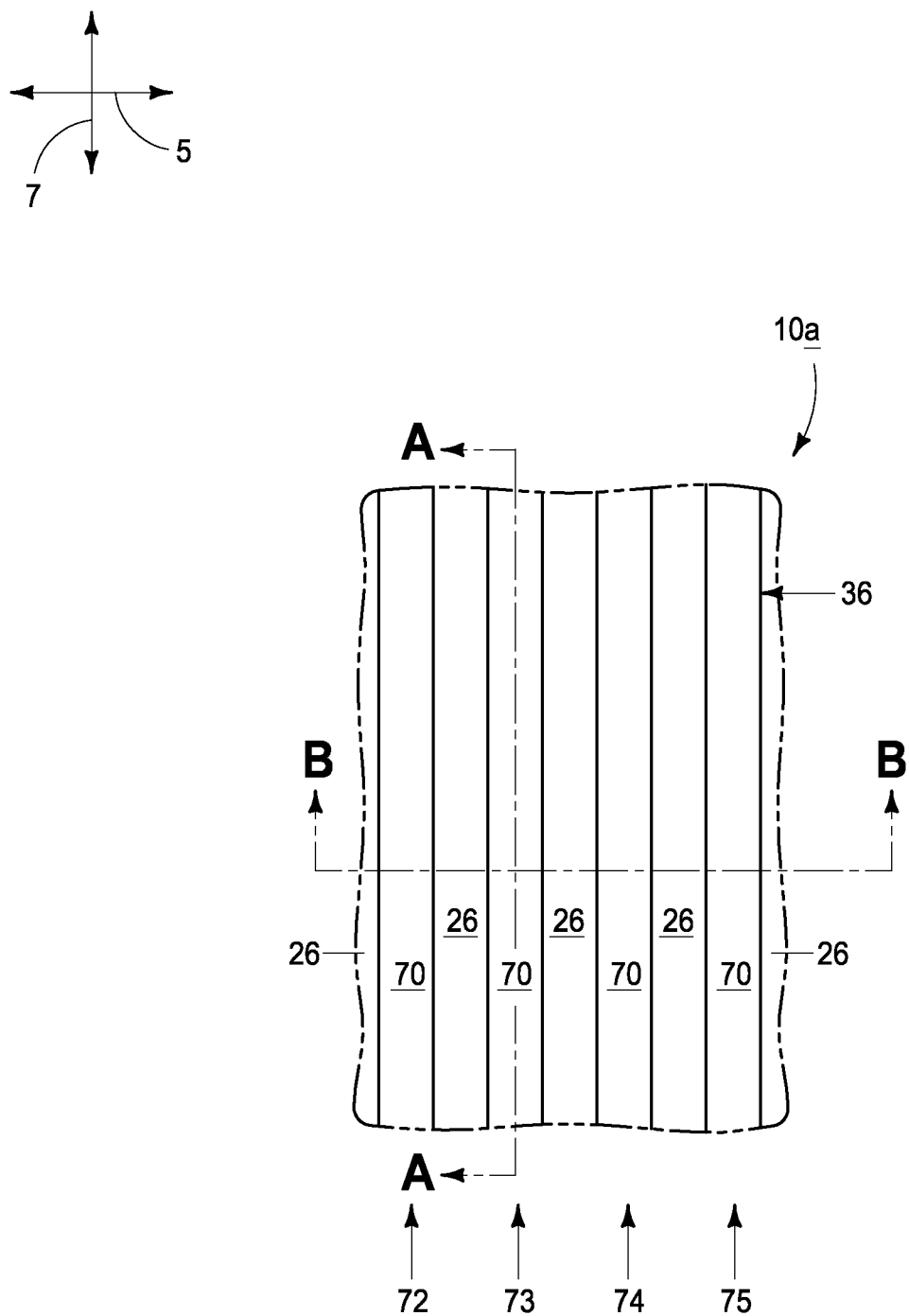
FIGS. 46-48 are a top view and cross-sectional side views of a construction at an example processing stage subsequent to that of FIGS. 43-45. The cross-sectional views of FIGS. 47 and 48 are along the lines A-A and B-B, respectively, of FIG. 46.
Figure 47:
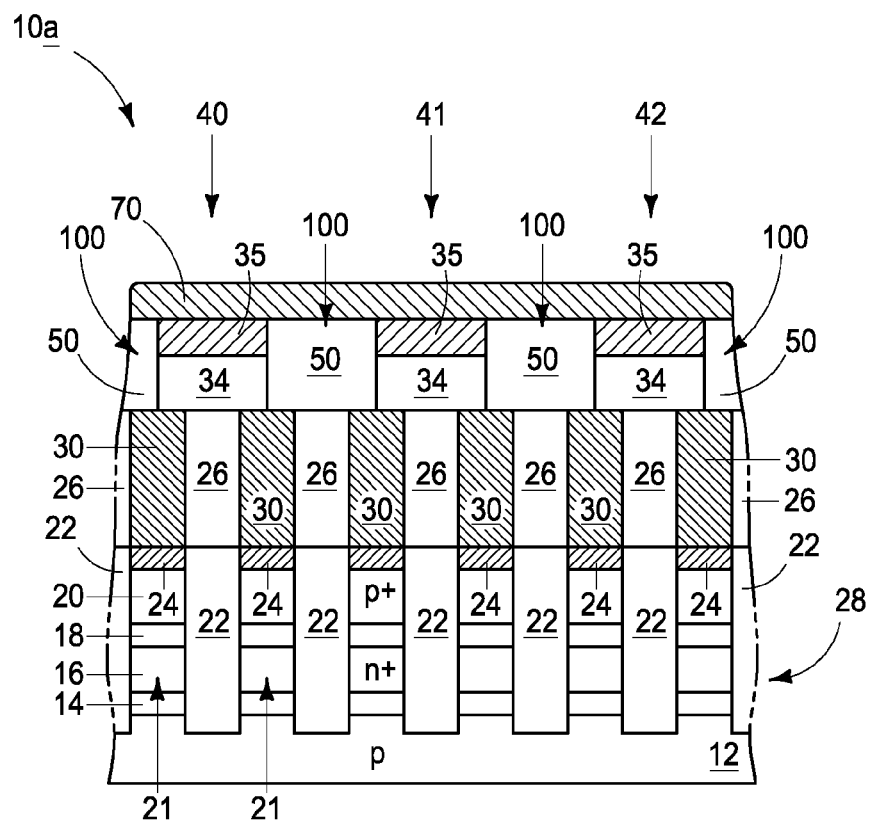
Figure 48:
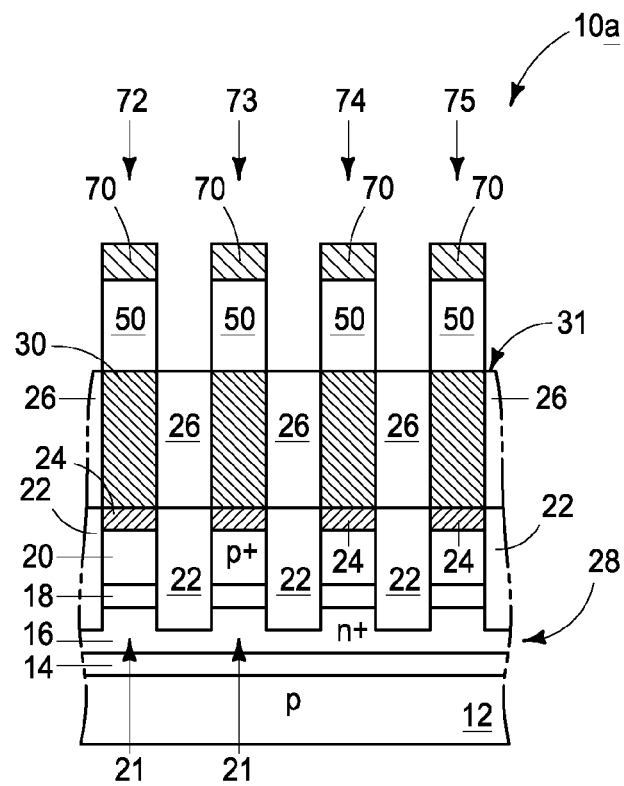

Referring to FIGS. 46-48, the electrically conductive material 70 is patterned into bitlines 72-75, and linear structures comprising materials 34 and 35 are sliced to form bridging structures analogous to the structures 76-88 of FIG. 34 (not labeled in FIGS. 46-48). The programmable material 50 is also sliced, and is incorporated into memory cells adjacent materials 34 and 35. In the shown embodiment, the programmable material 50 forms pillars 100 within the memory cells. Although it may appear that the programmable material 50 may short adjacent memory cells in the cross-sectional view of FIG. 47 (specifically, the programmable material 50 pillars extend across two adjacent nodes), such will not be problematic if programmable material 50 is sufficiently electrically insulative. If shorting between adjacent memory cells is problematic for a particular composition of programmable material 50, a dielectric material may be provided down the middle of each of the programmable material pillars of FIG. 47 to alleviate or prevent any problematic shorting.

The electronic devices discussed above may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, clocks, televisions, cell phones, personal computers, automobiles, industrial control systems, aircraft, etc.

The terms "dielectric" and "electrically insulative" are both utilized to describe materials having insulative electrical properties. Both terms are considered synonymous in this disclosure. The utilization of the term "dielectric" in some instances, and the term "electrically insulative" in other instances, is to provide language variation within this disclosure to simplify antecedent basis within the claims that follow, and is not utilized to indicate any significant chemical or electrical differences.

The particular orientation of the various embodiments in the drawings is for illustrative purposes only, and the embodiments may be rotated relative to the shown orientations in some applications. The description provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections in order to simplify the drawings.

When a structure is referred to above as being "on" or "against" another structure, it can be directly on the other structure or intervening structures may also be present. In contrast, when a structure is referred to as being "directly on" or "directly against" another structure, there are no intervening structures present. When a structure is referred to as being "connected" or "coupled" to another structure, it can be directly connected or coupled to the other structure, or intervening structures may be present. In contrast, when a structure is referred to as being "directly connected" or "directly coupled" to another structure, there are no intervening structures present.

In some embodiments, a semiconductor construction includes a resistive material structure along the sidewall surface of a height-defining structure over a first electrode. The height-defining structure comprises first electrically conductive material stacked over dielectric material. The resistive material structure is directly against both the first electrically conductive material and the dielectric material of the height-defining structure. A second electrode is electrically coupled to the first electrically conductive material of the height-defining structure.

In some embodiments, a semiconductor construction includes a stack over first electrodes. The stack comprises first electrically conductive material over dielectric material, and comprises opposing sidewall surfaces. Programmable material structures are along the sidewall surfaces and electrically coupled with the first electrodes. The programmable material structures are directly against both the first electrically conductive material and the dielectric material of the stack. A second electrode extends across the stack. The second electrode is electrically coupled with the first electrically conductive material.

Some embodiments include a semiconductor construction comprising spaced-apart electrical nodes supported by a semiconductor substrate. Stacks are over paired nodes. The stacks comprise first electrically conductive material over dielectric material, and comprise opposing sidewall surfaces. Programmable material structures are along the sidewall surfaces. The programmable material structures are directly against both the first electrically conductive material and the dielectric material of the stacks. Electrically conductive lines of second electrically conductive material extend across the stacks. The electrically conductive lines are over and directly against the first electrically conductive material and the programmable material structures. The electrically conductive lines are in a one-to-many relationship with the stacks.

Some embodiments include a semiconductor construction comprising spaced-apart electrical nodes supported by a semiconductor substrate. Upper surfaces of the nodes form a two-dimensional array having rows and columns, with the columns being substantially orthogonal to the rows. Nodes within a common row as one another are coupled to one another through wordlines under the rows. Bridging structures are over the nodes and bridge pairs of nodes to one another. The bridging structures extend in a direction substantially orthogonal to the wordlines. The bridging structures comprise first electrically conductive material stacked over dielectric material, and comprise opposing sidewall surfaces. Programmable material structures are along the sidewall surfaces. The programmable material structures are directly against both the first electrically conductive material and the dielectric material of the bridging structures. Electrically conductive bitlines of second electrically conductive material extend across the bridging structures. The bitlines are over and directly against the first electrically conductive material and the programmable material structures. The bitlines extend along columns of the two-dimensional array.

Some embodiments include a method of forming memory cells in which a stack is formed to comprise first electrically conductive material over dielectric material. The stack is patterned into a first line extending along a first direction. The first line has a sidewall surface. A resistive material plate is formed along the sidewall surface of the first line, the resistive material plate is along and directly against both the first electrically conductive material and the dielectric material of the stack. The resistive material plate is a linear structure extending along the first direction. A second electrically conductive material is over and electrically coupled to the first electrically conductive material. The second electrically conductive material is patterned into a conductive line extending along a second direction that intersects the first direction. The patterning extends through the linear structure.

Some embodiments include a method of forming memory cells in which a stack comprising first electrically conductive material over dielectric material is patterned into a first line extending along a first direction. The first line has a pair of opposing sidewall surfaces. Programmable material plates are formed along the sidewall surfaces of the first line. The plates are along and directly against both the first electrically conductive material and the dielectric material of the stack. The plates have upper edges. A planarized upper surface extends across the first electrically conductive material and the upper edges of the programmable material plates. The programmable material plates are linear structures extending along the first direction. A second electrically conductive material is formed on the planarized upper surface and directly against the first electrically conductive material and the upper edges of the programmable material plates. The second electrically conductive material is patterned into conductive lines extending along a second direction that intersects the first direction. The patterning extends through the linear structures to subdivide the plates into a plurality of separated memory cell structures.

Some embodiments include a method of forming memory cells in which a plurality of spaced-apart electrical nodes are formed to be supported by a semiconductor substrate. A stack is formed over the spaced-apart electrical nodes. The stack comprises first electrically conductive material over first dielectric material. The stack is patterned into a series of first lines extending along a first direction. Each first line comprises a pair of opposing sidewall surfaces. The first lines are spaced from one another by gaps. A film of phase change material is formed over and between the first lines. The film extends along the sidewall surfaces of the first lines. Second dielectric material is formed over the phase change material. Some of the phase change material is removed from gaps between the first lines, and the phase change material is removed from over the first lines, to leave phase change material linear structures along the sidewall surfaces of the first lines. The phase change material linear structures are angled plates which have horizontal portions directly against the nodes and which have non-horizontal portions extending upwardly from the horizontal portions. The non-horizontal portions are directly against the first dielectric material and the first electrically conductive material of the stack. The phase change material linear structures have exposed top edges and exposed lateral sidewall edges. The exposed top edges and exposed lateral sidewall edges are covered with third dielectric material. The third dielectric material is removed from over the stack and from over the top edges of the phase change material linear structures to form a planarized upper surface that extends across the first conductive material and across the top edges. A second conductive material is formed across the planarized upper surface. The second electrically conductive material is patterned into a second series of lines extending along a second direction that intersects the first direction. The patterning also slices the first lines into spaced apart segments, and slices the phase change material linear structures into memory cell structures that are in one-to-one correspondence with the nodes.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. A semiconductor construction, comprising:
    spaced-apart electrical nodes supported by a semiconductor substrate, upper surfaces of the nodes forming a two-dimensional array having rows and columns, with the columns being substantially orthogonal to the rows; nodes within a common row as one another being coupled to one another through wordlines under the rows;
    bridging structures over the nodes and bridging pairs of nodes to one another; the bridging structures extending in a direction substantially orthogonal to the wordlines; the bridging structures comprising first electrically conductive material stacked over dielectric material; the bridging structures comprising opposing sidewall surfaces;
    programmable material structures along the sidewall surfaces, the programmable material structures being directly against both the first electrically conductive material and the dielectric material of the bridging structures; each programmable material structure having two opposing sides; one of said sides being directly against both the first electrically conductive material and the dielectric material of the bridging structures and the other of the opposing sides being directly against an insulative structure; the insulative structure comprising three different dielectric materials; one of said three different dielectric materials being configured as a container shape, and another of the three-different dielectric materials being entirely within said container shape; the three different dielectric materials differing in composition relative to one another; and
    electrically conductive bitlines of second electrically conductive material extending across the bridging structures; the electrically conductive bitlines being over and directly against the first electrically conductive material and the programmable material structures; the electrically conductive bitlines extending along columns of the two-dimensional array.

2. The semiconductor construction of claim 1 wherein the programmable material structures comprise vertical regions extending along the sidewall surfaces of the bridging structures.

3. The semiconductor construction of claim 1 wherein the programmable material structures are angled plates.

4. The semiconductor construction of claim 1 wherein the programmable material is phase change material.

5. The semiconductor construction of claim 1 wherein the wordlines are spaced from the nodes by pn diodes.

6. The semiconductor construction of claim 1 wherein the wordlines are spaced from the nodes by bipolar junction transistors.

7. A method of forming memory cells, comprising:
    forming a plurality of spaced-apart electrical nodes supported by a semiconductor substrate;
    forming a stack over the spaced-apart electrical nodes, the stack comprising first electrically conductive material over first dielectric material;
    patterning the stack into a series of first lines extending along a first direction;
    each first line comprising a pair of opposing sidewall surfaces; the first lines being spaced from one another by gaps;
    forming a film of phase change material over and between the first lines, the film extending along the sidewall surfaces of the first lines;
    forming second dielectric material over the phase change material;
    removing some of the phase change material from gaps between the first lines and removing the phase change material from over the first lines to leave phase change material linear structures along the sidewall surfaces of the first lines; the phase change material linear structures being angled plates having horizontal portions directly against the nodes and having non-horizontal portions extending upwardly from the horizontal portions; the non-horizontal portions being directly against the first dielectric material and the first electrically conductive material of the stack; the phase change material linear structures having exposed top edges and exposed lateral sidewall edges;
    covering the exposed top edges and exposed lateral sidewall edges with third dielectric material; the third dielectric material forming troughs between the phase change material linear structures;
    filling the troughs with fourth dielectric material;

removing the third and fourth dielectric materials from over the stack and from over the top edges of the phase change material linear structures to form a planarized upper surface extending across the first conductive material, across the to edges of the phase change material linear structures, across the third dielectric material and across the fourth dielectric material;

forming a second conductive material across the planarized upper surface; and patterning the second electrically conductive material into a second series of lines extending along a second direction that intersects the first direction; the patterning also slicing the first lines into spaced apart segments, and slicing the phase change material linear structures into memory cell structures that are in one-to-one correspondence with the nodes.

8. The method of claim 7 wherein the first, second and third dielectric materials are a same composition as one another.

9. The method of claim 7 wherein the first, second and third dielectric materials comprise silicon nitride.

10. The method of claim 9 wherein the fourth dielectric material comprises silicon dioxide.

11. The method of claim 7 wherein the second and third dielectric materials differ in composition relative to one another.

* * * * *